(12) United States Patent
Jeon et al.

(10) Patent No.: US 11,393,728 B2
(45) Date of Patent: Jul. 19, 2022

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Yong-Ho Jeon, Hwaseong-si (KR); Hyunwoo Choi, Seoul (KR); Se-Koo Kang, Hwaseong-si (KR); Miri Joung, Seongnam-si (KR)

(73) Assignee: SAMSUNG ELECTRONICS CO., LTD.

( * ) Notice: Subject to any disclaimer, the term of this patent is extended or adjusted under 35 U.S.C. 154(b) by 88 days.

(21) Appl. No.: 16/917,317

(22) Filed: Jun. 30, 2020

(65) Prior Publication Data

US 2021/0057288 A1 Feb. 25, 2021

(30) Foreign Application Priority Data

Aug. 23, 2019 (KR) .................. 10-2019-0104026

(51) Int. Cl.
| | |
|---|---|
| *H01L 21/8238* | (2006.01) |
| *H01L 27/092* | (2006.01) |
| *H01L 21/308* | (2006.01) |
| *H01L 29/78* | (2006.01) |
| *H01L 21/033* | (2006.01) |
| *H01L 29/66* | (2006.01) |
| *H01L 29/06* | (2006.01) |

(52) U.S. Cl.
CPC .. *H01L 21/823821* (2013.01); *H01L 21/0332* (2013.01); *H01L 21/0337* (2013.01); *H01L 21/3086* (2013.01); *H01L 27/0922* (2013.01); *H01L 29/0642* (2013.01); *H01L 29/6681* (2013.01); *H01L 29/66545* (2013.01); *H01L 29/66553* (2013.01); *H01L 29/7851* (2013.01)

(58) Field of Classification Search
CPC ......... H01L 21/823821; H01L 21/0332; H01L 21/0337; H01L 21/3086; H01L 27/0922; H01L 29/0642; H01L 29/66545; H01L 29/66553; H01L 29/6681; H01L 29/7851
See application file for complete search history.

(56) References Cited

U.S. PATENT DOCUMENTS

| | | |
|---|---|---|
| 9,917,021 B2 | 3/2018 | Cheng et al. |
| 9,997,519 B1 | 6/2018 | Bao et al. |
| 10,103,065 B1 | 10/2018 | Mochizuki et al. |
| 10,256,161 B2 | 4/2019 | Jagannathan et al. |

(Continued)

*Primary Examiner* — Christine A Enad
(74) *Attorney, Agent, or Firm* — Myers Bigel, P.A.

(57) ABSTRACT

Methods of fabricating semiconductor devices comprise forming first active patterns vertically spaced apart on a first active fin of a substrate and second active patterns vertically spaced apart on a second active fin of the substrate that has a first region on which the first active fin is formed and a second region on which the second active fin is formed, forming a first electrode layer on the first and second active fins and the first and second active patterns, forming a first mask pattern overlapping the first electrode layer on the first region, forming a second mask pattern overlapping the first electrode layer on the second region, and using the second mask pattern as an etching mask to etch the first mask pattern and the first electrode layer on the first region to form a first electrode pattern on the second region.

19 Claims, 28 Drawing Sheets

(56) References Cited

U.S. PATENT DOCUMENTS

| | | | |
|---|---|---|---|
| 2015/0054051 A1* | 2/2015 | Wang | H01L 29/788 257/316 |
| 2016/0379982 A1* | 12/2016 | You | H01L 29/0657 257/369 |
| 2017/0352548 A1 | 12/2017 | Liu et al. | |
| 2018/0197858 A1 | 7/2018 | Clevenger | |
| 2018/0211995 A1* | 7/2018 | Bak | H01L 27/228 |
| 2018/0233580 A1 | 8/2018 | Xie et al. | |
| 2018/0308767 A1 | 10/2018 | Mochizuki et al. | |
| 2018/0315667 A1 | 11/2018 | Kwon et al. | |
| 2018/0350955 A1 | 12/2018 | Chen et al. | |
| 2020/0161188 A1* | 5/2020 | Liao | H01L 21/268 |

* cited by examiner

SEMICONDUCTOR DEVICE AND METHOD OF FABRICATING THE SAME

CROSS-REFERENCE TO RELATED APPLICATION

This U.S. nonprovisional application claims priority under 35 U.S.C § 119 to Korean Patent Application No. 10-2019-0104026 filed on Aug. 23, 2019, in the Korean Intellectual Property Office, the disclosures of which are hereby incorporated by reference in their entirety.

BACKGROUND

The present inventive concepts relate to a semiconductor device and a method of fabricating the same, and more particularly to, a semiconductor device with increased reliability and a method of fabricating the same.

Semiconductor devices are beneficial in the electronics industry because of their small size, multi-functionality, and/or low fabrication cost. Semiconductor devices may encompass semiconductor memory devices storing logic data, semiconductor logic devices processing operations of logic data, and hybrid semiconductor devices having both memory and logic elements. Semiconductor devices have been increasingly fabricated for high integration with the advanced development of the electronics industry. For example, semiconductor devices have been increasingly requested for high reliability, high speed, and/or multi-functionality. Semiconductor devices have been gradually becoming more complicated and more integrated to meet these requested characteristics.

SUMMARY

Some example embodiments of the present inventive concepts provide a method of fabricating a semiconductor device with increased reliability.

Some example embodiments of the present inventive concepts provide a semiconductor device having improved reliability.

According to some example embodiments of the present inventive concepts, a method of fabricating a semiconductor device may include forming a plurality of first active patterns on a first active fin of a substrate such that the plurality of active patterns are spaced apart at a first distances from each other in a direction perpendicular to the substrate, and forming a plurality of second active patterns on a second active fin of the substrate such that the plurality of second active patterns are spaced apart at second distances from each other in the direction perpendicular to the substrate. The substrate includes a first region on which the first active fin is formed and a second region on which the second active fin is formed. The method includes forming a first electrode layer that extends on top surfaces and sidewalls of the first and second active fins and extends on surfaces of the first and second active patterns, forming a first mask pattern that extends on the first electrode layer formed on the first region of the substrate, forming a second mask pattern that extends on the first electrode layer formed on the second region of the substrate. and using the second mask pattern as an etching mask to etch the first mask pattern and a portion of the first electrode layer that is on the first region of the substrate to form a first electrode pattern on the second region of the substrate.

According to some example embodiments of the present inventive concepts, a method of fabricating a semiconductor device may include forming a plurality of first active patterns on a first active fin of a substrate such that the plurality of first active patterns are spaced apart at first distances from each other in a direction perpendicular to the substrate, and forming a plurality of second active patterns on a second active fin of a substrate such that the plurality of second active patterns are spaced apart at second distances from each other in the direction perpendicular to the substrate. The substrate includes a first region on which the first active fin is formed and a second region on which the second active fin is formed. The method includes forming a first electrode layer that extends on top surfaces and sidewalls of the first and second active fins and extends on surfaces of the first and second active patterns, forming a first mask pattern that extends on the first electrode layer formed on the second region of the substrate, and using the first mask pattern as an etching mask to etch a portion of the first electrode layer formed on the first region to form a first electrode pattern on the second region of the substrate. A sidewall of the first mask pattern may have an angle relative to a top surface of the substrate. The sidewall of the first mask pattern may be adjacent to the first region of the substrate. The angle relative to the top surface of the substrate may range from 91° to 100°.

According to some example embodiments of the present inventive concepts, a semiconductor device may include a device isolation layer between a first active region and a second active region of a substrate, a first active fin on the first active region and a second active fin on the second active region, a first electrode pattern that is on the first active fin and the second active fin, and a second electrode pattern between the first electrode pattern and the second active fin. The second electrode pattern may extend on the device isolation layer and may have an end adjacent to the first active region of the substrate. A sidewall of the end of the second electrode pattern may have an angle relative to a top surface of the substrate. The angle relative to the top surface of the substrate may range from 80° to 89°.

DETAILED DESCRIPTION

Figure 1A:
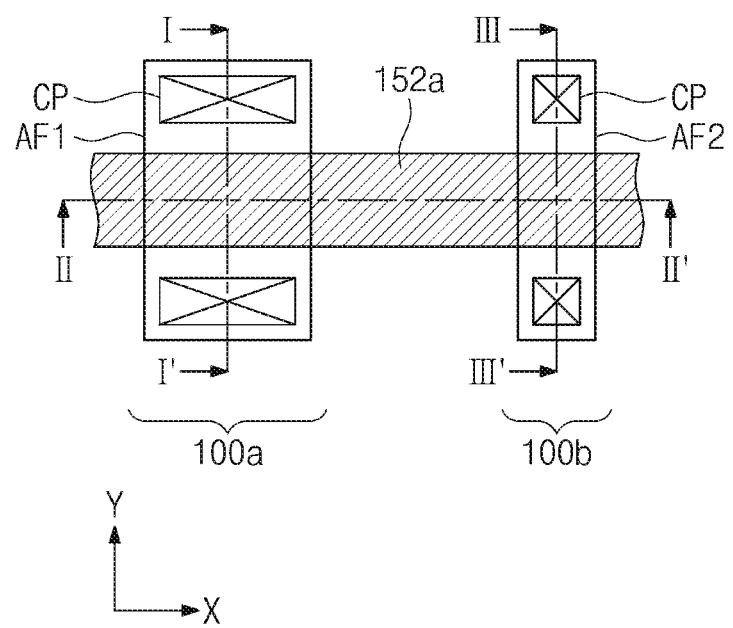
FIG. 1A illustrates a plan view of a semiconductor device according to some example embodiments of the present inventive concepts.
Figure 1B:
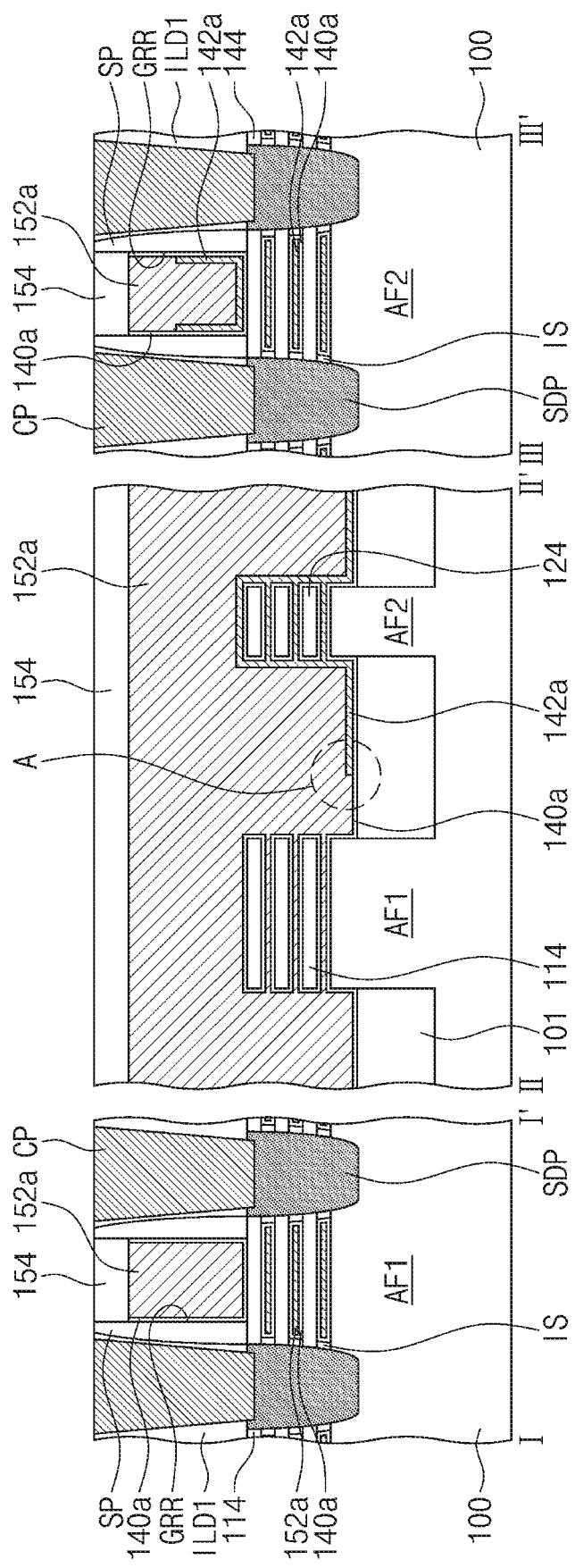
FIG. 1B illustrates a cross-sectional view taken along line I-I' of FIG. 1A, of a semiconductor device according to some example embodiments of the present inventive concepts.
Figure 1C:
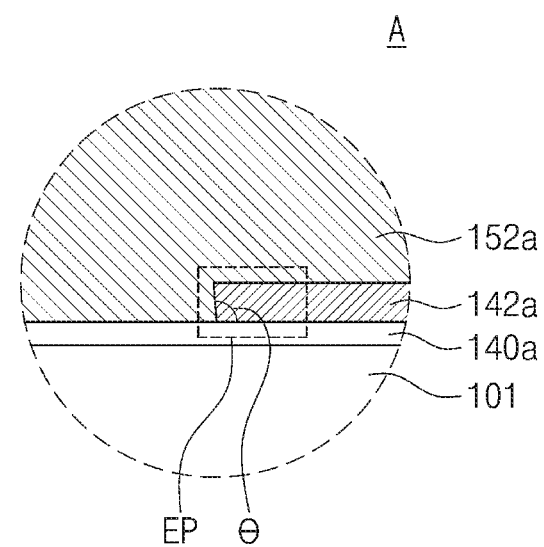
FIG. 1C illustrates an enlarged view of section A in FIG. 1B, of a semiconductor device according to some example embodiments of the present inventive concepts.

FIG. 1A illustrates a plan view of a semiconductor device according to some example embodiments of the present inventive concepts. FIG. 1B illustrates a cross-sectional view taken along line I-I' of FIG. 1A, of a semiconductor device according to some example embodiments of the present inventive concepts. FIG. 1C illustrates an enlarged view of section A in FIG. 1B, of a semiconductor device according to some example embodiments of the present inventive concepts.

Referring to FIGS. 1A and 1B, a device isolation layer 101 may be disposed in a substrate 100. The device isolation layer 101 may define a first active region 100a and a second active region 100b of the substrate 100. A first active fin AF1 may be disposed on the first active region 100a of the substrate 100, and a second active fin AF2 may be disposed on the second active region 100b of the substrate 100. The first and second active fins AF1 and AF2 may protrude in a vertical direction from a top surface of the substrate 100. The first and second active fins AF1 and AF2 may extend in a second direction Y and may be spaced apart from each other in a first direction X intersecting the second direction Y. In some embodiments, the first active fin AF1 may have a width greater than that of the second active fin AF2.

First active patterns 114 may be disposed on the first active fin AF1. The first active patterns 114 may be spaced apart from each other in the vertical direction on a top surface of the first active fin AF1. Second active patterns 124 may be disposed on the second active fin AF2. The second active patterns 124 may be spaced apart from each other in the vertical direction on a top surface of the second active fin AF2.

A second electrode pattern 152a may be disposed on the first active fin AF1, the second active fin AF2, the first active patterns 114, and the second active patterns 124. The second electrode pattern 152a may run in the first direction X across the first and second active fins AF1 and AF2. The second electrode pattern 152a may fill or at least partially fill or occupy spaces between the first active patterns 114. A first electrode pattern 142a may be disposed between the second electrode pattern 152a and the second active fin AF2 and between the second electrode pattern 152a and the second active patterns 124. The first electrode pattern 142a may cover or overlap top surface, sidewalls, and/or bottom surfaces of the first active patterns 114. The first electrode pattern 142a may cover or overlap the top surface and/or sidewall of the second active fin AF2. The first electrode pattern 142a may fill or at least partially fill or occupy spaces between the second active patterns 124. A portion of the first electrode pattern 142a on an uppermost one of the second active patterns 124 may extend onto portions of sidewalls of the second electrode pattern 152a. The portion of the first electrode pattern 142a on the uppermost second active pattern 124 may have a U shape with respect to the substrate. In some embodiments, the first electrode pattern 142a that at least partially fills or occupies spaces between the second active patterns 124 and the second electrode pattern 152a may have a inverted-U shape with respect to the substrate. The first electrode pattern 142a may extend onto a top surface of the device isolation layer 101 adjacent to the second active fin AF2 and the second active patterns 124. Referring together to FIG. 1C, a sidewall of an end EP of the first electrode pattern 142a adjacent to the first active region 100a of the substrate 100 may define a boundary between the first active region 100a and the second active region 100b. The sidewall of the end EP of the first electrode pattern 142a may have an angle θ relative to the top surface of the substrate 100. The angle θ may range from 80° to 89°, according to some embodiments.

A gate dielectric pattern 140a may be interposed between the second electrode pattern 152a and the first active patterns 114, between the second electrode pattern 152a and the first active fin AF1, between the first electrode pattern 142a and the second active patterns 124, and between the first electrode pattern 142a and the second active fin AF2. The gate dielectric pattern 140a may surround in a cross-sectional view the top surface, bottom surfaces, and/or sidewalls of the first and second active patterns 114 and 124, and also surround in a cross-sectional view the top surfaces and sidewalls of the first and second active fins AF1 and AF2. The gate dielectric pattern 140a may extend onto sidewalls of each of the first and second electrode patterns 142a and 152a.

A gate capping pattern 154 may be disposed on a top surface of the second electrode pattern 152a. The gate capping pattern 154 may cover or overlap the top surface of the second electrode pattern 152a. Spacers SP may be disposed on the sidewalls of the first electrode pattern 142a, the sidewalls of the second electrode pattern 152a, and/or sidewalls of the gate capping pattern 154. The spacers SP may extend in the first direction X on the sidewalls of the first electrode pattern 142a, the sidewalls of the second electrode pattern 152a, and/or the sidewalls of the gate capping pattern 154.

Source/drain patterns SDP may be disposed on the substrate 100 on opposite sides of the second electrode pattern 152a. The source/drain patterns SDP may be epitaxial layers grown from the substrate 100 serving as a seed layer. The source/drain patterns SDP may have their top surfaces coplanar with that of an uppermost first active pattern 114 and/or that of an uppermost second active pattern 124. Inner spacers IS may be disposed between each of the source/drain patterns SDP and the gate dielectric pattern 140a between the first active patterns 114, and may also be disposed between each of the source/drain patterns SDP and the gate dielectric pattern 140a between the second active patterns 124. The inner spacers IS may be disposed in a space between the first active patterns 114 and in a space between the second active patterns 124. The inner spacers IS may be in contact with sidewalls of the source/drain patterns SDP.

An interlayer dielectric layer ILD1 may be disposed on the source/drain patterns SDP. The interlayer dielectric layer ILD1 may cover or overlap the top surfaces of the source/drain patterns SDP. The interlayer dielectric layer 110 may have a top surface coplanar with that of the gate capping pattern 154. Contact plugs CP may be disposed on the source/drain patterns SDP. The contact plugs CP may penetrate the interlayer dielectric layer ILD1 to come into contact with the source/drain patterns SDP.

FIGS. 2A, 3A, 4A, 5A, 6A, 7A, 8A, and 9A illustrate plan views of a method of fabricating a semiconductor device according to some example embodiments of the present inventive concepts. FIGS. 2B, 3B, 4B, 5B, 6B, 7B, 8B, 9B and 10 illustrate cross-sectional views taken along lines I-I', II-II', and III-III' of FIGS. 2A, 3A, 4A, 5A, 6A, 7A, 8A, and 9A, of a method of fabricating a semiconductor device according to some example embodiments of the present inventive concepts.

Figure 2A:
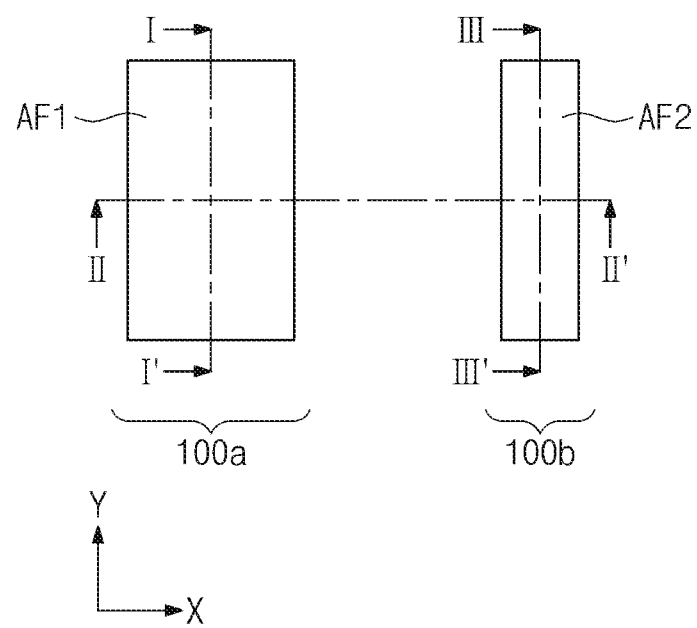
FIGS. 2A, 3A, 4A, 5A, 6A, 7A, 8A, and 9A illustrate plan views of a method of fabricating a semiconductor device according to some example embodiments of the present inventive concepts.
Figure 2B:
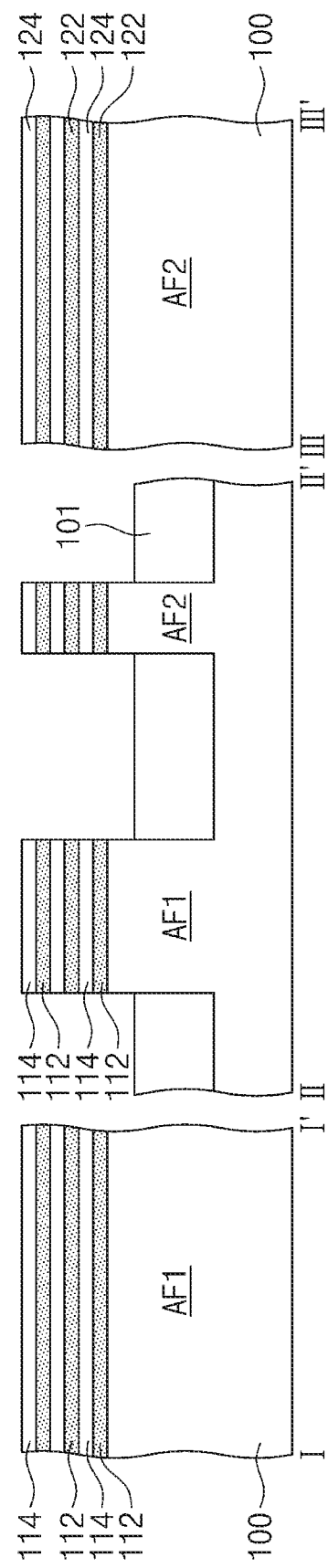
FIGS. 2B, 3B, 4B, 5B, 6B, 7B, 8B, 9B, and 10 illustrate cross-sectional views taken along lines I-I', II-II', and III-III' of FIGS. 2A, 3A, 4A, 5A, 6A, 7A, 8A, and 9A, of a method of fabricating a semiconductor device according to some example embodiments of the present inventive concepts.

Referring to FIGS. 2A and 2B, first sacrificial patterns 112 and first active patterns 114 may be formed stacked alternately and repeatedly on a top surface of the first active fin AF1. Second sacrificial patterns 122 and second active patterns 124 may be formed stacked alternately and repeatedly on a top surface of the second active fin AF2. The formation of the first and second sacrificial patterns 112 and 122, the first and second active patterns 114 and 124, and the first and second active fins AF1 and AF2 may include forming sacrificial and active layers alternately and repeatedly stacked on a substrate 100, and performing a patterning process on the sacrificial layers, the active layers, and an upper portion of the substrate 100. The sacrificial layers (i.e., sacrificial patterns) may be formed of a material having an etch selectivity with respect to the active layers (i.e., active patterns). The first and second sacrificial patterns 112 and 122 may include, for example, silicon germanium (SiGe). The first and second active patterns 114 and 124 may include, for example, silicon (Si).

A device isolation layer 101 may be formed in the substrate 100. The device isolation layer 101 may be formed by filling or at least partially fillings a recess region that is formed after the patterning process for forming the first and second sacrificial patterns 112 and 122 and the first and second active patterns 114 and 124. The device isolation layer 101 may define a first active region 100a and a second active region 100b of the substrate 100. For example, the first active region 100a may be an NMOS area where NMOS transistors are formed, and the second active region 100b may be a PMOS area where PMOS transistors are formed. For another example, the first active region 100a may be an NMOS area, and the second active region 100b may be an NMOS area. For another example, the first active region 100a may be a PMOS area, and the second active region 100b may be a PMOS area. As another example, the first active region 100a may be an PMOS area where PMOS transistors are formed, and the second active region 100b may be a NMOS area where NMOS transistors are formed. A first active fin AF1 may be formed on the first active region 100a of the substrate 100, and a second active fin AF2 may be formed on the second active region 100b of the substrate 100. The first and second active fins AF1 and AF2 may protrude in a vertical direction from a top surface of the substrate 100. The first and second active fins AF1 and AF2 may be spaced apart from each other in a first direction X and may extend in a second direction Y intersecting the first direction X. The first and second active fins AF1 and AF2 may have their top surfaces at a higher level than that of a top surface of the device isolation layer 101, with respect to the substrate. The first active fin AF1 may have a width greater than that of the second active fin AF2. The substrate 100 may be a silicon substrate, a germanium substrate, or a silicon-on-insulator (SOI) substrate. The device isolation layer 101 may include a dielectric material (e.g., a silicon oxide layer or a silicon nitride layer).

Figure 3A:
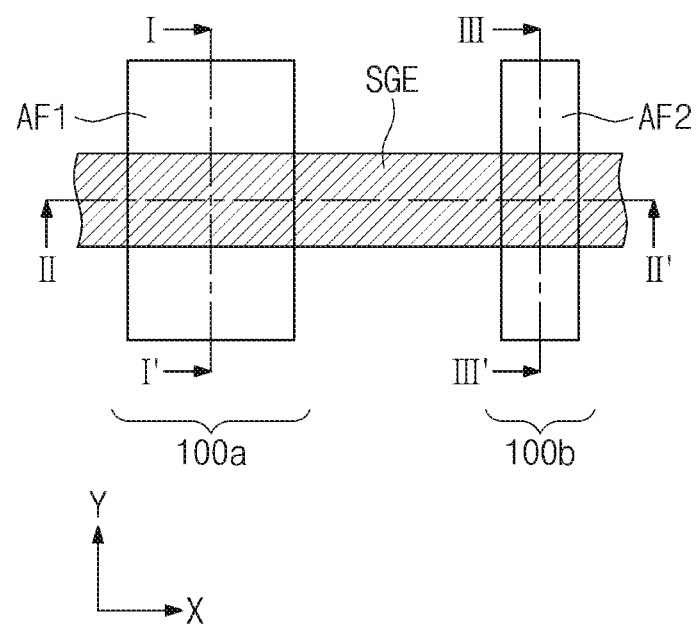
Figure 3B:
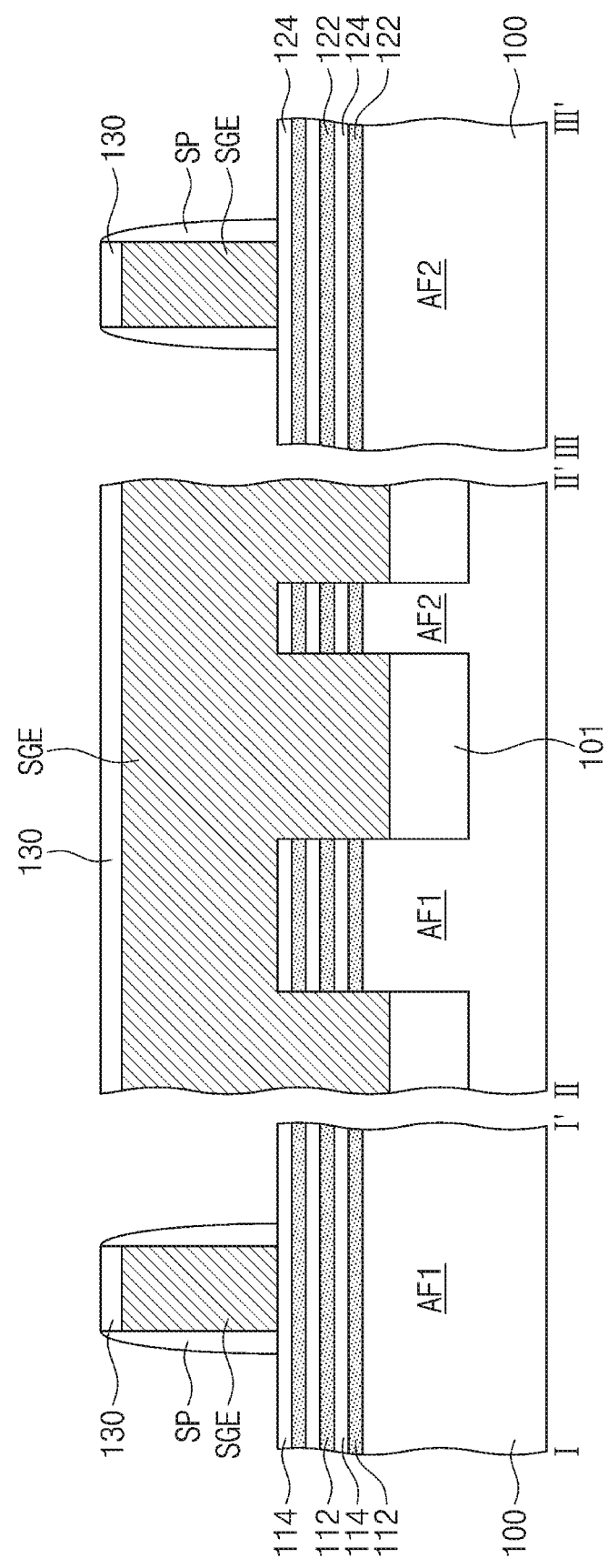

Referring to FIGS. 3A and 3B, a sacrificial gate pattern SGE and a sacrificial capping pattern 130 may be sequentially formed on the substrate 100. The sacrificial gate pattern SGE and the sacrificial capping pattern 130 may run in the first direction X across the first and second active fins AF1 and AF2. The formation of the sacrificial gate pattern SGE and the sacrificial capping pattern 130 may include forming a sacrificial gate layer (not shown) to cover the device isolation layer 101, the first and second sacrificial patterns 112 and 122, and the first and second active patterns 114 and 124, forming the sacrificial capping pattern 130 on the sacrificial gate layer, and then using the sacrificial capping pattern 130 as an etching mask to perform a patterning process on the sacrificial gate layer. The sacrificial gate pattern SGE may partially cover or partially overlap sidewalls of the first and second sacrificial patterns 112 and 122, sidewalls of the first and second active patterns 114 and 124, a top surface of an uppermost first active pattern 114, and/or a top surface of an uppermost second active pattern 124. The sacrificial gate pattern SGE may be formed of a material having an etch selectivity with respect to that of the first and second sacrificial patterns 112 and 122 and that of the first and second active patterns 114 and 124. The sacrificial gate pattern SGE may include, for example, polysilicon. The sacrificial capping pattern 130 may include a dielectric material (e.g., a silicon nitride layer).

Spacers SP may be formed on sidewalls of the sacrificial gate pattern SGE and sidewalls of the sacrificial capping pattern 130. The formation of the spacers SP may include forming a spacer layer (not shown) to conformally cover a top surface of the sacrificial capping pattern 130, the sidewalls of the sacrificial gate pattern SGE, the sidewalls of the first and second sacrificial patterns 112 and 122 exposed by the sacrificial gate pattern SGE, the top surfaces of the uppermost first and second active patterns 114 and 124, and then performing an etching process on the spacer layer. For example, the etching process may include an etch-back process. The spacers SP may include, for example, a silicon oxide layer.

Figure 4A:
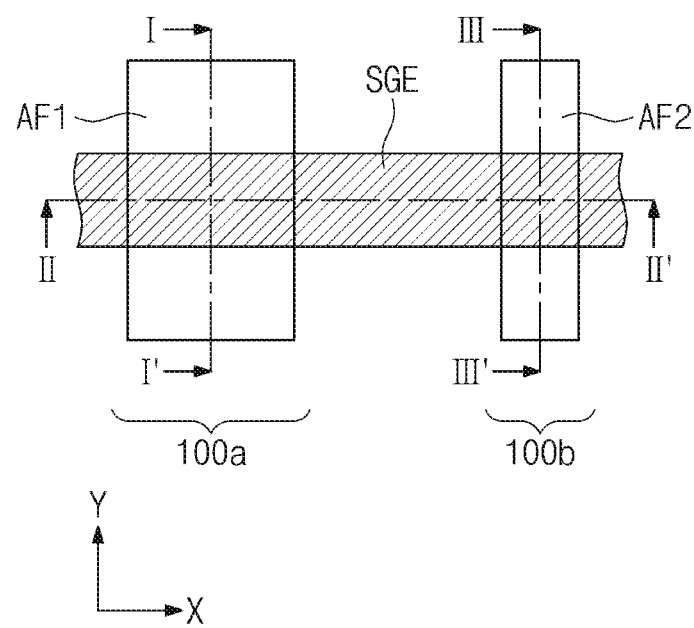
Figure 4B:
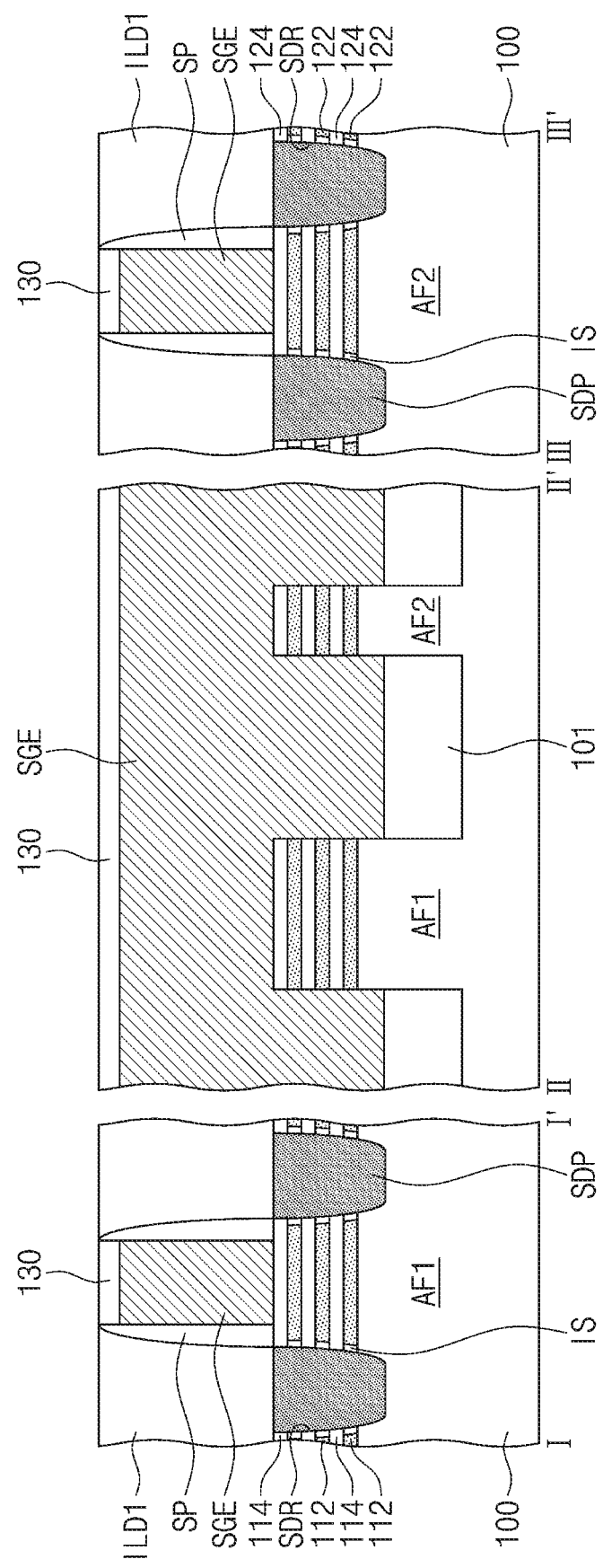

Referring to FIGS. 4A and 4B, an etching process may be performed to etch upper portions of the first and second active fins AF1 and AF2, the first and second active patterns 114 and 124, and the first and second sacrificial patterns 112 and 122 exposed by the sacrificial gate pattern SGE and the spacers SP, thereby forming source/drain recess regions SDR. The substrate 100 may be exposed on bottom surfaces of the source/drain recess regions SDR. The etching process may include a dry etching process.

An etching action may be performed on portions of the first and second sacrificial patterns 112 and 122 exposed to the source/drain recess regions SDR. Therefore, the first and second sacrificial patterns 112 and 122 may have reduced widths in the second direction Y. The removal of the portions of the first and second sacrificial patterns 112 and 122 may form empty spaces between the first active patterns 114 adjacent to each other in a vertical direction and between the second active patterns 124 adjacent to each other in the vertical direction with respect the substrate.

Inner spacers IS may be formed in the empty spaces. The inner spacers IS may be formed by filling or at least partially filling the empty spaces with a dielectric layer that covers or overlaps sidewalls of the source/drain recess regions SDR and then performing, on the dielectric layer, an etching process to leave the dielectric layer in the empty space. The inner spacers IS may include, for example, a silicon oxide layer.

Source/drain patterns SDP may be formed by performing an epitaxial growth process in which the substrate 100 exposed by the source/drain recess regions SDR is used as a seed. The source/drain patterns SDP may be formed to fill the source/drain recess regions SDR. The source/drain patterns SDP may be formed to have their top surfaces substantially coplanar with those of uppermost first and second active patterns 114 and 124. The source/drain patterns SDP may include the same material as that of the substrate 100. The source/drain patterns SDP may include, for example, silicon. An ion implantation process may be performed on the source/drain patterns SDP. The source/drain patterns SDP may include impurities. The impurities may be, for example, boron (B) or phosphorus (P).

An interlayer dielectric layer ILD1 may be formed on the source/drain patterns SDP. The interlayer dielectric layer ILD1 may be formed by forming a dielectric layer to cover or overlap top surfaces of the sacrificial capping pattern 130 and the source/drain patterns SDP and then performing a polishing process on the dielectric layer. The polishing process may continue until the top surface of the sacrificial capping pattern 130 is exposed. A chemical mechanical polishing process may be employed as the polishing process. The interlayer dielectric layer ILD1 may be, for example, a silicon oxide layer.

Figure 5A:
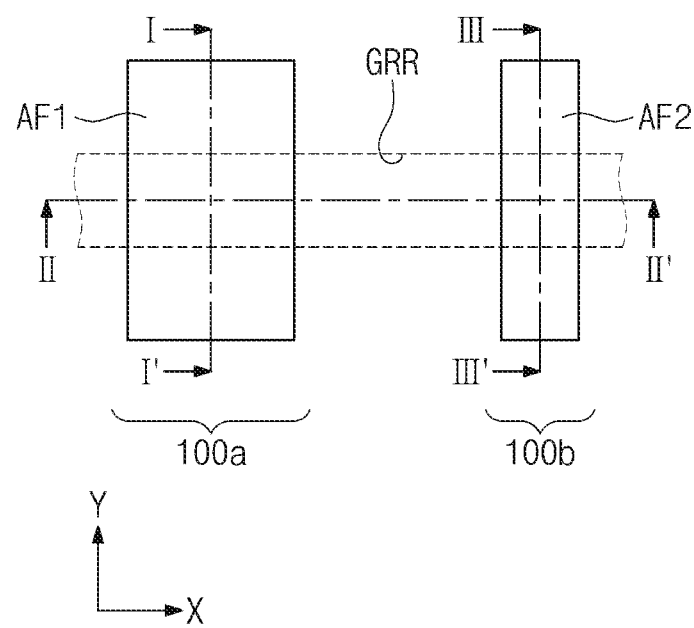
Figure 5B:
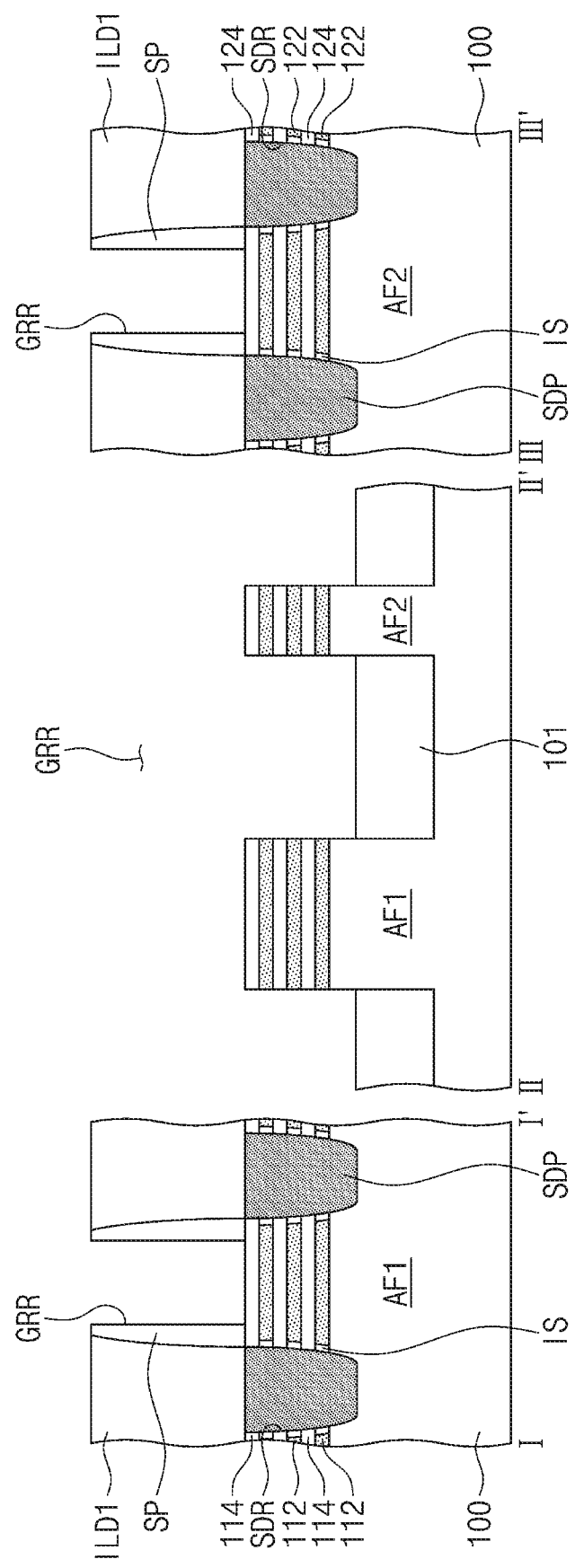

Referring to FIGS. 5A and 5B, the sacrificial capping pattern 130 may be removed, and an upper portion of the interlayer dielectric layer ILD1 may be partially removed. Accordingly, a top surface of the sacrificial gate pattern SGE may be exposed. The sacrificial capping pattern 130 may undergo an etching process to expose the top surface of the sacrificial gate pattern SGE. The etching process may include a chemical mechanical polishing (CMP) process or an etch-back process.

The sacrificial gate pattern SGE may be removed to form a gate recess region GRR. The gate recess region GRR may be an area defined by the spacers SP. The gate recess region GRR may extend in the first direction X. The gate recess region GRR may partially expose the sidewalls of the first and second sacrificial patterns 112 and 122, the sidewalls of the first and second active patterns 114 and 124, the top surface of the uppermost first active pattern 114, the top surface of the uppermost second active pattern 124, the sidewall of the first active fin AF1, the sidewall of the second active fin AF2, and/or the top surface of the device isolation layer 101. The gate recess region GRR may expose inner sidewalls of the spacers SP. The sacrificial gate pattern SGE may be selectively removed by using an etching recipe that has an etch selectivity with respect to the first and second sacrificial patterns 112 and 122, the first and second active patterns 114 and 124, and/or the spacers SP.

Figure 6A:
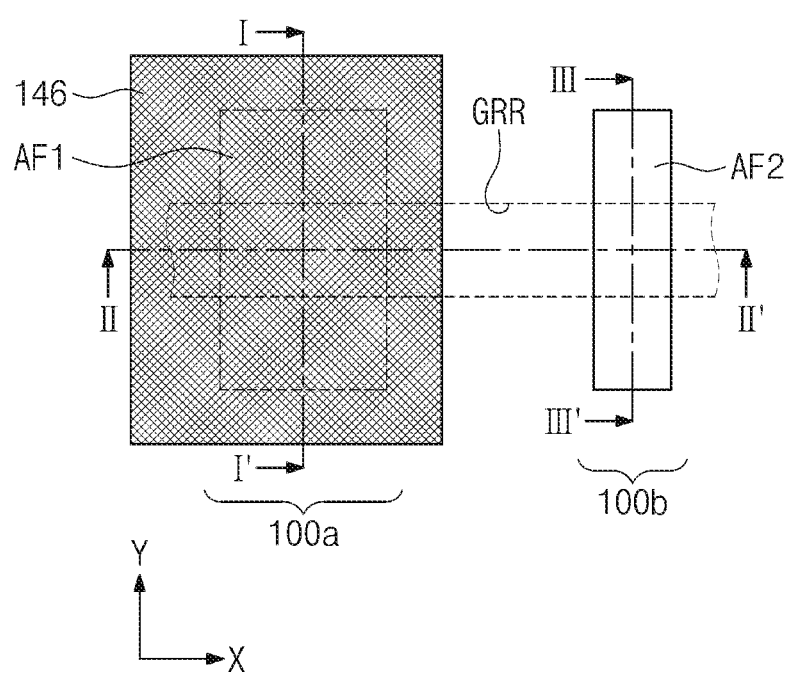
Figure 6B:
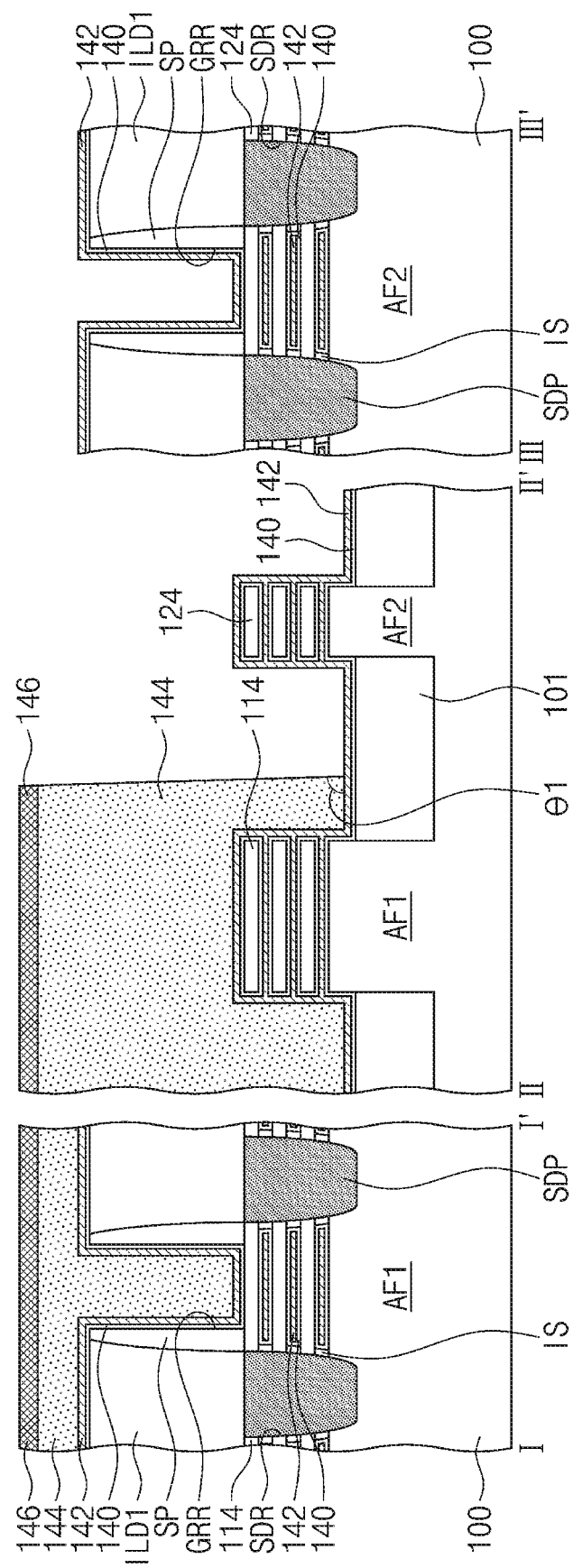

Referring to FIGS. 6A and 6B, an etching process may be performed to remove the first and second sacrificial patterns 112 and 122 exposed to the gate recess region GRR. The first and second sacrificial patterns 112 and 122 may be selectively removed by using an etch recipe that has an etch selectivity with respect to the first and second active patterns 114 and 124 and the source/drain patterns SDP. The first and second sacrificial patterns 112 and 122 may be removed to form spaces between the first active patterns 114 adjacent to each other in a vertical direction and also to form spaces between the second active patterns 124 adjacent to each other in the vertical direction. The spaces may expose top and bottom surfaces of the first and second active patterns 114 and 124. The etching process may be a wet etching process, which uses an etch recipe that has an etch selectivity with respect to the first and second active patterns 114 and 124, the source/drain patterns SDP, and/or the spacers SP.

A gate dielectric layer 140 may be formed in the gate recess region GRR. The gate dielectric layer 140 may conformally cover surfaces of the first and second active patterns 114 and 124 exposed to the gate recess region GRR, the top surfaces and sidewalls of the first and second active fins AF1 and AF2 exposed to the gate recess region GRR, the top surface of the device isolation layer 101 exposed to the gate recess region GRR, the inner sidewalls of the spacers SP exposed to the gate recess region GRR, and/or a top surface of the interlayer dielectric layer ILD1. The gate dielectric layer 140 may include one or more of a silicon oxide layer and a high-k dielectric layer (e.g., one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate).

A first electrode layer 142 may be formed on the gate dielectric layer 140. The first electrode layer 142 may conformally cover or overlap a top surface of the gate dielectric layer 140, and may be formed to fill or at least partially fill spaces between the first active patterns 114 adjacent to each other in a vertical direction and also to fill or at least partially fill spaces between the second active patterns 124 adjacent to each other in the vertical direction with respect to the substrate. The first electrode layer 142 may include one or more of TiN, TaN, AlN, WN, or MoN.

A first mask pattern 144 and a second mask pattern 146 may be formed on the first active region 100a of the substrate 100. The formation of the first and second mask patterns 144 and 146 may include forming a first mask layer (not shown) on the first and second active regions 100a and 100b of the substrate 100 on which the first electrode layer 142 is formed, forming on the first active region 100a of the substrate 100 the second mask pattern 146 that covers or overlaps a top surface of the first mask layer, and using the second mask pattern 146 as an etching mask to pattern the first mask layer (not shown). On the second active region 100b of the substrate 100, the first and second mask patterns 144 and 146 may expose the first electrode layer 142 that partially covers or overlaps the top surface and sidewall of the second active fin AF2 and the surfaces of the second active patterns 124. The first mask pattern 144 may have a sidewall adjacent to the second active region 100b of the substrate 100, and the sidewall of the first mask pattern 144 may have a first angle θ1 relative to the top surface of the substrate 100. The first angle θ1 may range, for example, from 80° to 89°. The first mask pattern 144 may include, for example, a bottom antireflective coating (BARC) layer. The second mask pattern 146 may include $TiO_2$.

Figure 7A:
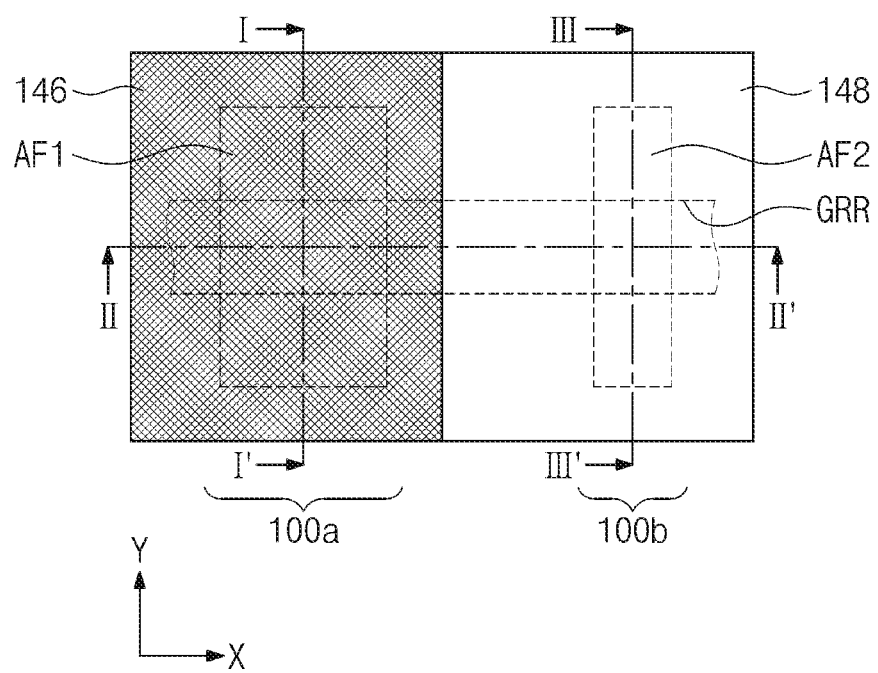
Figure 7B:
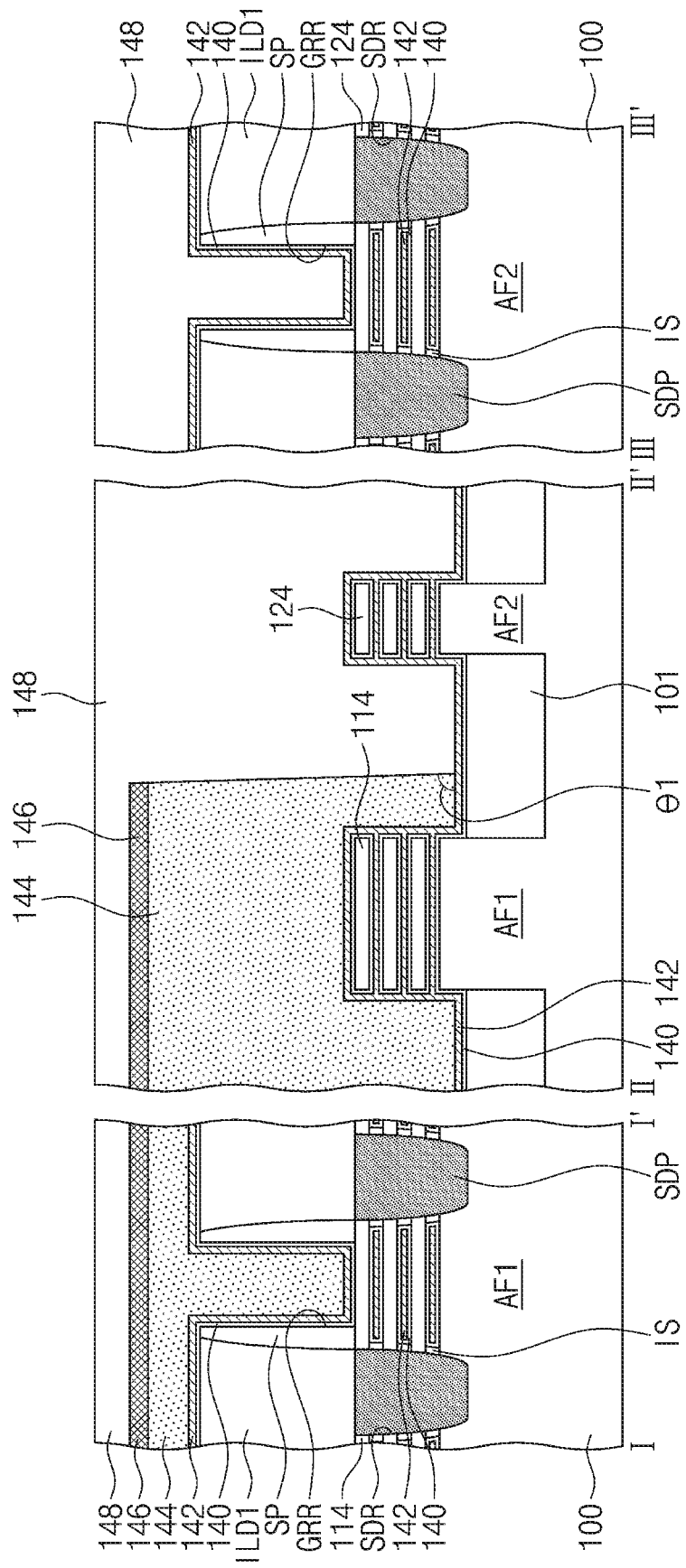

Referring to FIGS. 7A and 7B, a third mask layer 148 may be formed on the first and second active regions 100a and 100b of the substrate 100. The third mask layer 148 may cover or overlap the first electrode layer 142 formed on the second active region 100b of the substrate 100, and may also cover or overlap a sidewall of the first mask pattern 144 and a sidewall and top surface of the second mask pattern 146. The third mask layer 148 may be formed of a material that has an etch selectivity with respect to the first mask pattern 144. The third mask layer 148 may be a silicon-based spin-on-hardmask (Si-SOH) layer or a bottom antireflective coating (BARC) layer that includes impurities. The impurities may be, for example, silicon.

Figure 8A:
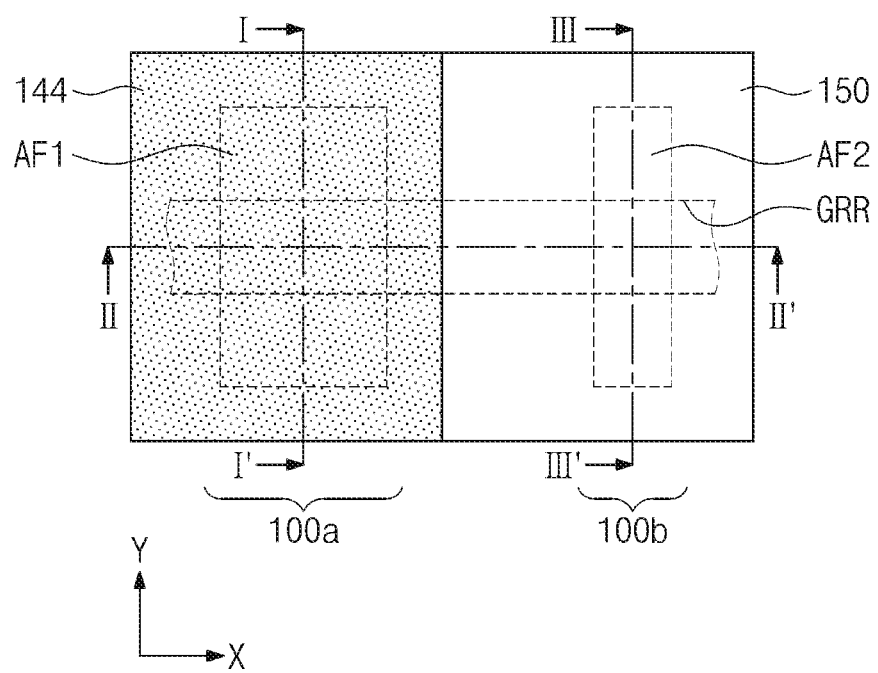
Figure 8B:
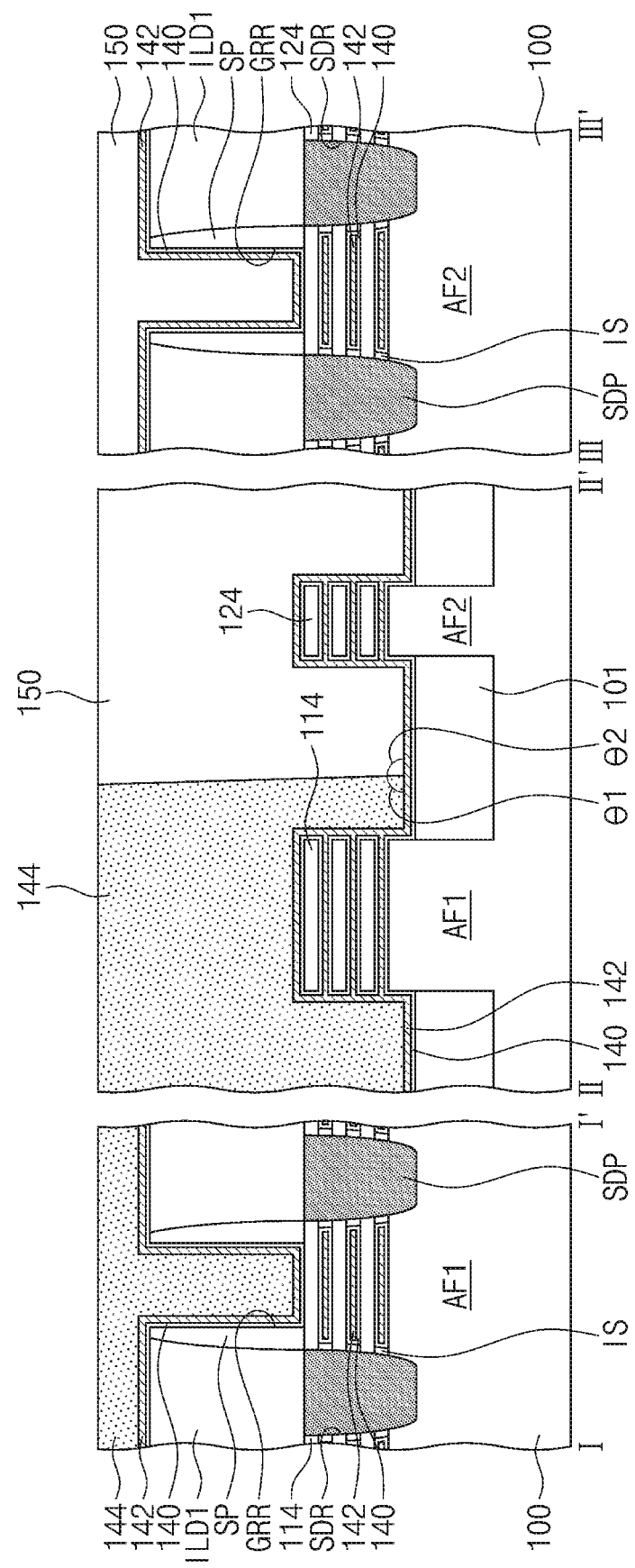

Referring to FIGS. 8A and 8B, an upper portion of the third mask layer 148 may be etched to form a third mask pattern 150 on the second active region 100b of the substrate 100. The third mask pattern 150 may be formed by etching an upper portion of the third mask layer 148 to expose the top surface of the second mask pattern 146 and successively etching the exposed second mask pattern 146. Thus, a top surface of the first mask pattern 144 may be exposed. The top surface of the first mask pattern 144 may be coplanar with that of the third mask pattern 150. The etching process may include an etch-back process and may use a fluorine-containing etch recipe (e.g., $CF_4$). For example, the third mask pattern 150 may have a sidewall adjacent to the first active region 100a of the substrate 100, and the sidewall of the third mask pattern 150 may have a second angle θ2. The second angle θ2 may range from 91° to 100°.

Figure 9A:
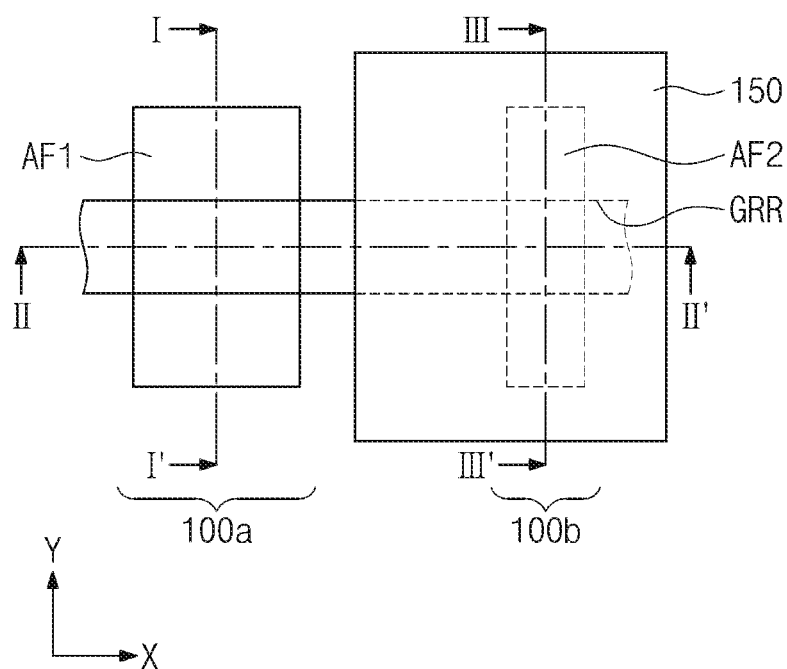
Figure 9B:
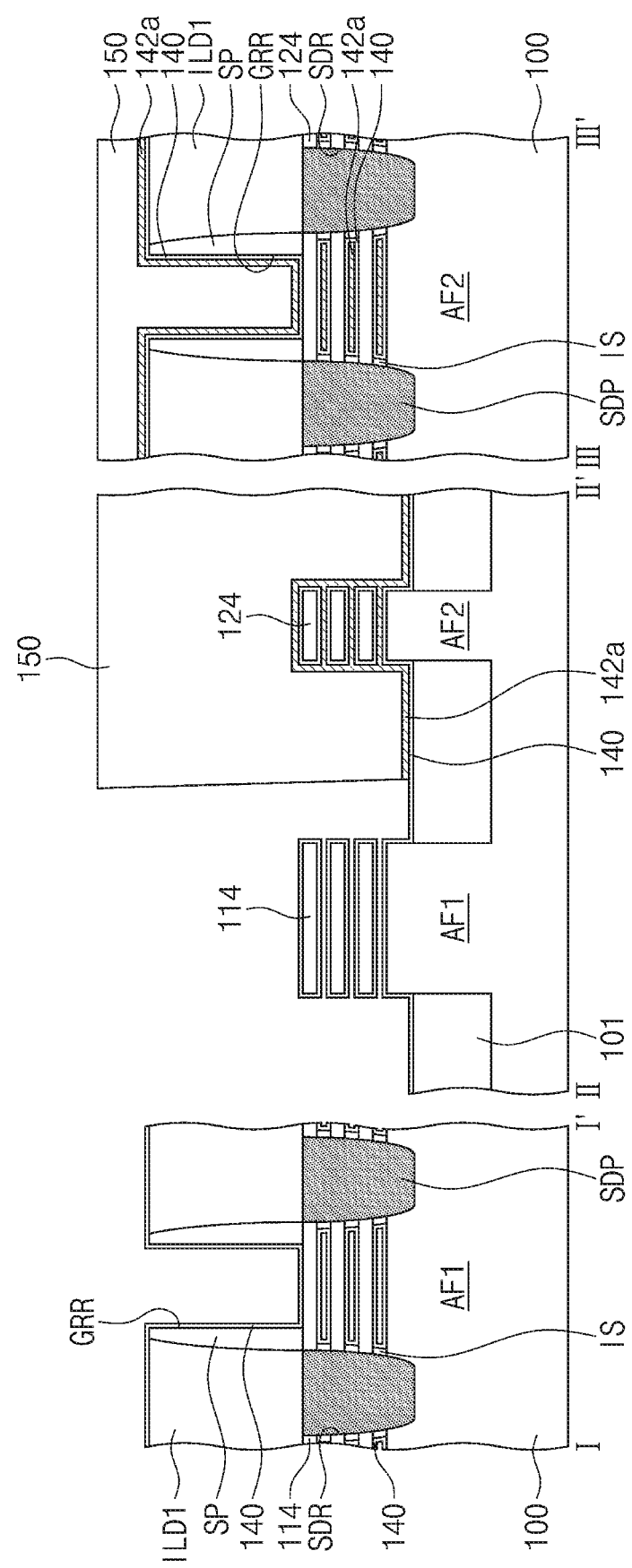

Referring to FIGS. 9A and 9B, a removal process may be performed to remove the first mask pattern 144 exposed by the third mask pattern 150 and also to remove the first electrode layer 142 from the first active region 100a of the substrate 100. Accordingly, the removal process may expose the gate dielectric layer 140 that covers or overlaps portions of the top surface and/or sidewall of the first active fin AF1 on the first active region 100a and also covers or overlaps portions of the surfaces of the first active patterns 114. The removal of the first electrode layer 142 formed on the first active region 100a of the substrate 100 may form a first electrode pattern 142a on the second active region 100b of the substrate 100. The first mask pattern 144 may be selectively removed by an ashing process that uses H2/N2. The first electrode pattern 142a may be formed by performing a wet etching process on the first electrode layer 142 exposed by the third mask pattern 150. In some embodiments, the wet etching process may continue to completely remove the first electrode layer 142 formed on the first active region 100a of the substrate 100. While the first mask pattern 144 and a portion of the first electrode layer 142 are etched, no removal may be achieved on the third mask pattern 150 that has an etch selectivity with respect to the first mask pattern 144 and the first electrode layer 142.

According to some embodiments of the present inventive concepts, the third mask pattern 150, used as an etching mask to pattern the first electrode layer 142, may be formed after the first mask pattern 144 is formed on the first active region 100a of the substrate 100 from which the first electrode layer 142 will be removed. The first mask pattern 144 may define an area where the third mask pattern 150 is formed. The first mask pattern 144 may be used to allow the third mask pattern 150 to have an optimal interval or a spacing from the first active fin AF1 formed on the first active region 100a of the substrate 100, and as a result, it may be possible to prevent damage to the first electrode pattern 142a formed on the second active region 100b of the substrate 100 and to prohibit the first electrode pattern 142a from remaining on the first active region 100a of the substrate 100.

Figure 10:
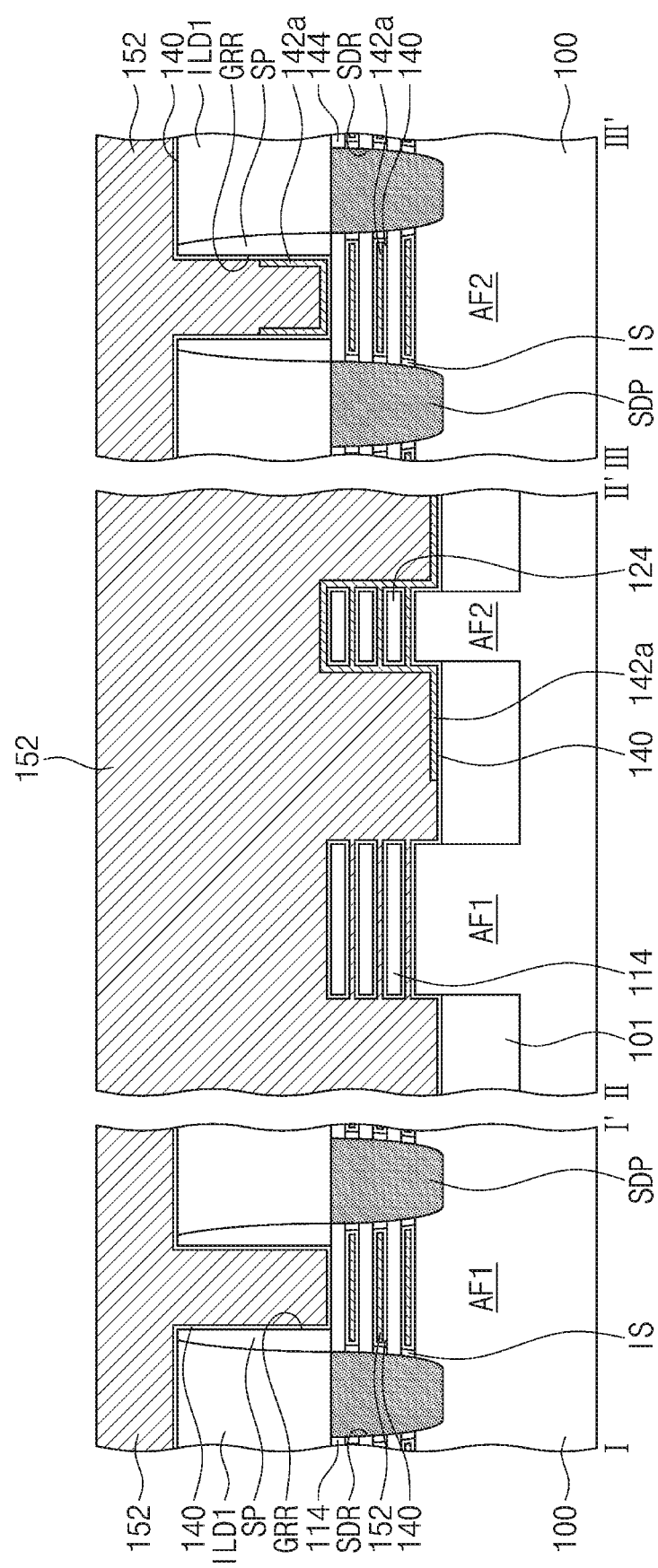

Referring to FIG. 10, the third mask pattern 150 may be removed to expose the first electrode pattern 142a. The third mask pattern 150 may be removed by a wet etching process. An etching process may be performed to partially etch the first electrode pattern 142a formed on the interlayer dielectric layer ILD1. Therefore, the first electrode pattern 142a may remain locally in the gate recess region GRR. The first electrode pattern 142a may lie on the second active region 100b of the substrate 100 and may partially expose the gate dielectric layer 140 that covers or overlaps the inner sidewalls of the spacers SP. The partial etching of the first electrode pattern 142a may be accomplished by using one or more of an ashing process and a strip process. A second electrode layer 152 may be formed on the first and second active regions 100a and 100b of the substrate 100. The second electrode layer 152 may be formed to cover or overlap top surfaces of the gate dielectric layer 140 and the first electrode pattern 142a and to fill the gate recess region GRR. The second electrode layer 152 may fill or at least partially fill a space between the first active fin AF1 and a lowermost first active pattern 114 and a space between the first active patterns 114. The second electrode layer 152 may include one or more of TiN, TaN, AlN, WN, or MoN.

Referring back to FIGS. 1A and 1B, the second electrode layer 152 and the gate dielectric layer 140 may undergo an etching process to form a second electrode pattern 152a and a gate dielectric pattern 140a in the gate recess region GRR. The gate dielectric pattern 140a and the second electrode pattern 152a may be formed locally in the gate recess region GRR. The gate dielectric pattern 140a and the second electrode pattern 152a may be formed to be recessed from the top surface of the interlayer dielectric layer ILD1. The top surface of the interlayer dielectric layer ILD1 may be exposed by the gate dielectric pattern 140a and the second electrode pattern 152a. The etching process may include a dry etching process or a wet etching process.

A gate capping pattern 154 may be formed in an upper portion of the gate recess region GRR. The gate capping pattern 154 may be formed by forming a dielectric layer to fill or at least partially fill the upper portion of the gate recess region GRR and to cover or overlap the top surface of the interlayer dielectric layer ILD1, and then performing a planarization process on the dielectric layer. The planarization process may continue until the top surface of the interlayer dielectric layer ILD1 is exposed. The planarization process may include an etch-back process or a chemical mechanical polishing process. The gate capping pattern 154 may include a dielectric material (e.g., a silicon nitride layer).

Contact plugs CP may be formed on the source/drain patterns SDP. The contact plugs CP may be formed by forming through holes to penetrate the interlayer dielectric layer ILD1 and to expose the top surfaces of the source/drain patterns SDP and then filling the through holes with a conductive material. The contacts plugs CP may include, for example, one or more of metal nitride (e.g., TiN, TaN, AlN, WN, or MoN), metal (e.g., W, Al, or Cu), or semiconductor silicide.

A semiconductor device according to some embodiments of the present inventive concepts may include a tunneling field effect transistor, a transistor including a nano-wire, a transistor including a nano-sheet (or, multi-bridge channel field effect transistor (MBCFET)), or a three-dimensional (3D) transistor.

FIGS. 11A, 12A, 13A, and 14A illustrate plan views of a method of fabricating a semiconductor device according to some example embodiments of the present inventive concepts. FIGS. 11B, 12B, 13B, and 14B illustrate cross-sectional views taken along lines I-I', II-II', and III-III' of FIGS. 11A, 12A, 13A, and 14A, of a method of fabricating a semiconductor device according to some example embodiments of the present inventive concepts.

Figure 11A:
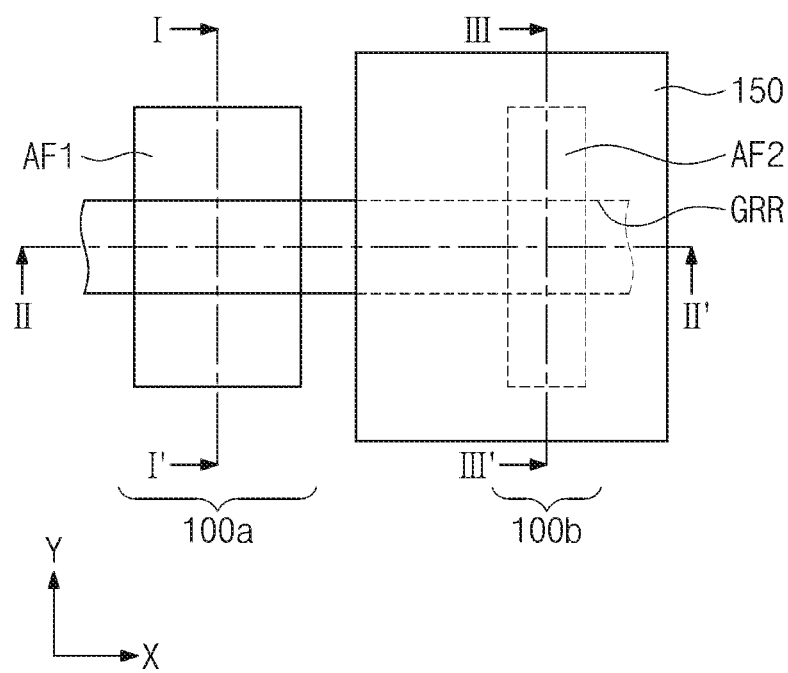
FIGS. 11A, 12A, 13A, and 14A illustrate plan views of a method of fabricating a semiconductor device according to some example embodiments of the present inventive concepts.
Figure 11B:
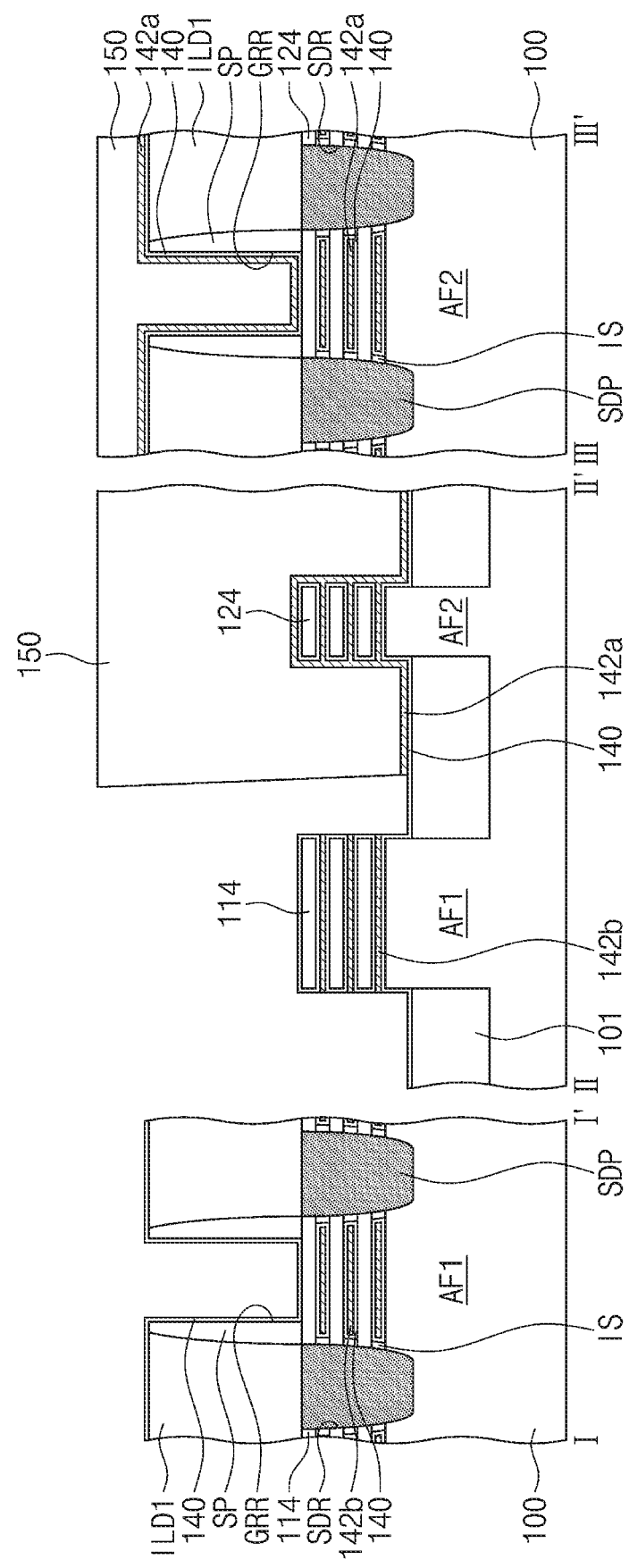
FIGS. 11B, 12B, 13B, and 14B illustrate cross-sectional views taken along lines I-I', II-II', and III-III' of FIGS. 11A to 14A, of a method of fabricating a semiconductor device according to some example embodiments of the present inventive concepts.

Referring to FIGS. 11A and 11B together with FIGS. 8A and 8B, an etching process may be performed on the first mask pattern 144 and the first electrode layer 142 that is formed on the first active region 100a of the substrate 100. Therefore, residual electrode patterns 142b may be formed on the first active region 100a of the substrate 100, and a first electrode pattern 142a may be formed on the second active region 100b of the substrate 100. The residual electrode patterns 142b may be formed in a space between the first active fin AF1 and the lowermost first active pattern 114 adjacent to each other in a vertical direction and spaces between the first active patterns 114 adjacent to each other in the vertical direction with respect to the substrate. The first mask pattern 144 may be selectively removed by an ashing process that uses H2/N2. The first electrode pattern 142a and the residual electrode patterns 142b may be formed by partially etching the first electrode layer 142 that is exposed by the third mask pattern 150 and covers or overlaps the sidewalls of first active fin AF1, the sidewalls of the first active patterns 114, the top surface of the device isolation layer 101, and/or the top surface of the uppermost first active pattern 114. The etching process on the first electrode layer 142 may be a wet etching process, and an etching time may be controlled such that the first electrode layer 142 may be partially etched to leave a portion of the first electrode layer 142.

Figure 12A:
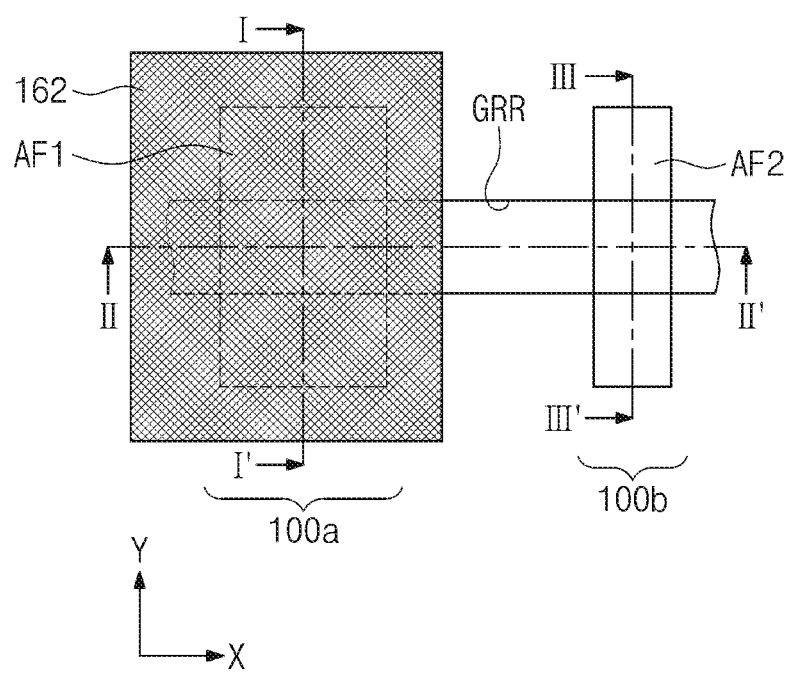
Figure 12B:
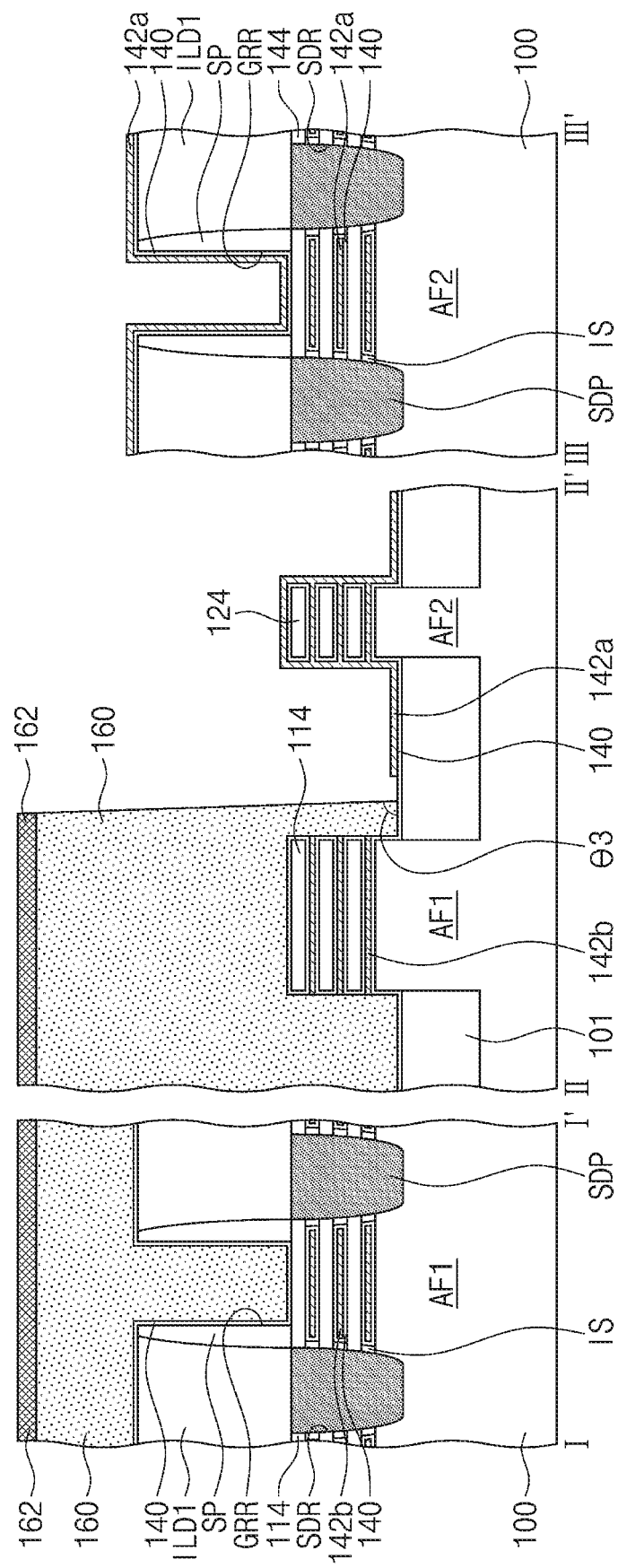

Referring to FIGS. 12A and 12B, the third mask pattern 150 may be removed. Therefore, the first electrode pattern 142a may be exposed.

A fourth mask pattern 160 and a fifth mask pattern 162 may be formed on the first active region 100a of the substrate 100. The fourth mask pattern 160 may fill or at least partially fill the gate recess region GRR formed on the first active region 100a of the substrate 100 and may cover the top surface of the gate dielectric layer 140 formed on the first active region 100a of the substrate 100. The fifth mask pattern 162 may be formed on a top surface of the fourth mask pattern 160. The formation of the fourth and fifth mask patterns 160 and 162 may include forming a fourth mask layer (not shown) on the first and second active regions 100a and 100b of the substrate 100, forming on the first active region 100a of the substrate 100 the fifth mask pattern 162 to cover of overlap a top surface of the fourth mask layer, and using the fifth mask pattern 162 as an etching mask to pattern the fourth mask layer. The fourth mask pattern 160 may completely expose the first electrode pattern 142a. The fourth mask pattern 160 may be formed physically spaced apart from the first electrode pattern 142a. The fourth mask pattern 160 may have a sidewall adjacent to the second active region 100b of the substrate 100, and the sidewall of the fourth mask pattern 160 may have a third angle θ3 relative to the top surface of the substrate 100. The third angle θ3 may range from 80° to 89°. The fourth mask pattern 160 may include a bottom antireflective coating (BARC) layer. The fifth mask pattern 162 may include, for example, $TiO_2$.

Figure 13A:
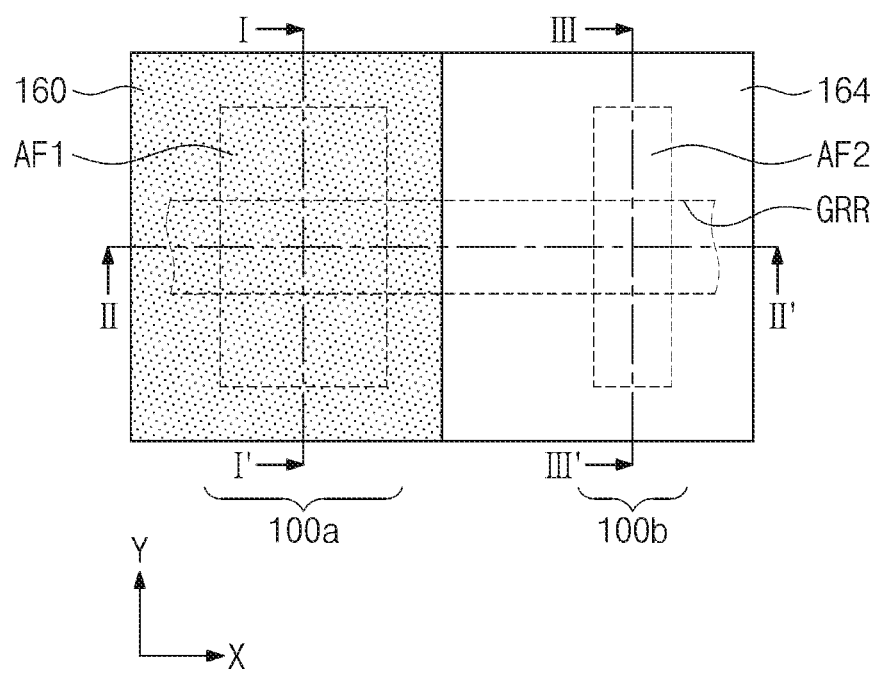
Figure 13B:
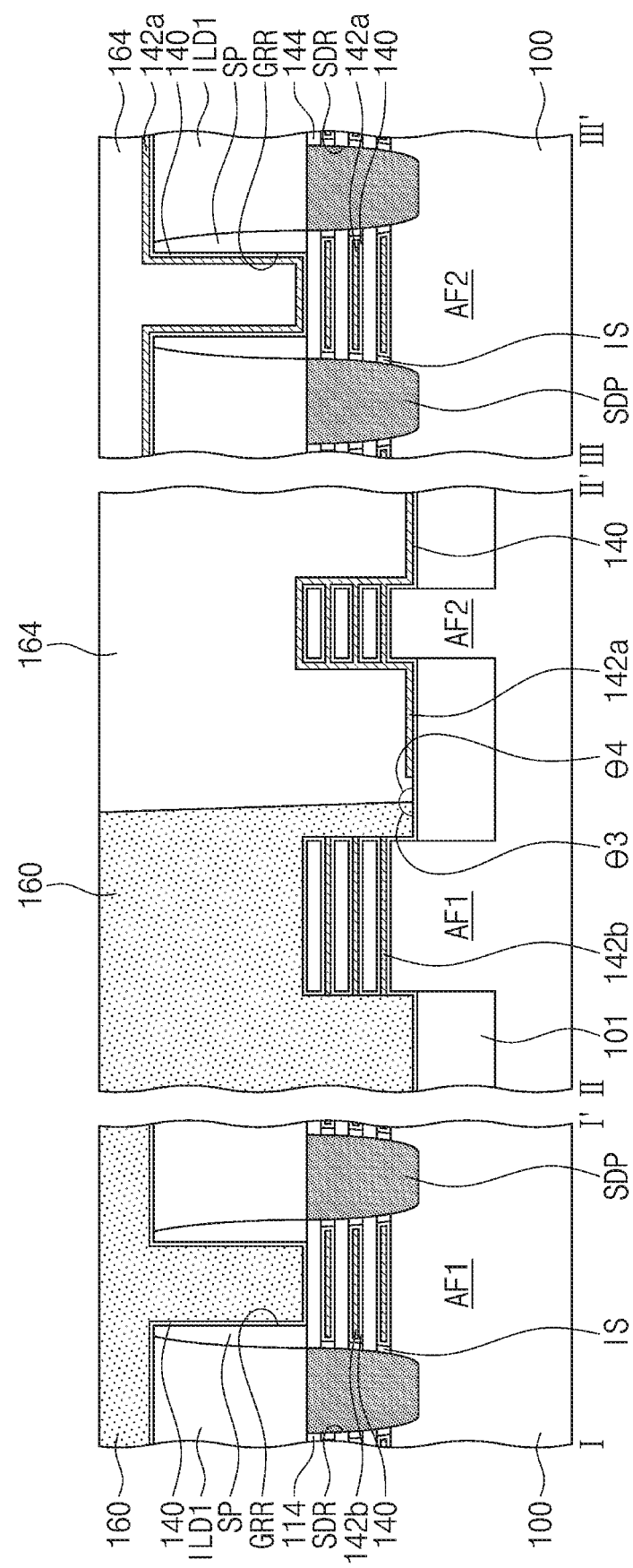

Referring to FIGS. 13A and 13B, a sixth mask pattern 164 may be formed on the second active region 100b of the substrate 100. The sixth mask pattern 164 may be formed to completely cover or overlap the first electrode pattern 142a formed on the second active region 100b of the substrate 100. The sixth mask pattern 164 may be a silicon-based spin-on-hardmask (Si-SOH) layer or a bottom antireflective coating layer (BARC) layer that includes impurities (e.g., silicon). The sixth mask pattern 164 may be formed by forming a sixth mask layer (not shown) to cover or overlap the first electrode pattern 142a, a sidewall of the fourth mask pattern 160, and/or a sidewall and a top surface of the fifth mask pattern 162, and then etching an upper portion of the sixth mask layer. The fifth mask pattern 162 may be successively removed, by the etching of the upper portion of the sixth mask layer. The etching process on the upper portion of the sixth mask layer and the fifth mask pattern 162 may include an etch-back process and may use a fluorine-containing etch recipe (e.g., $CF_4$). The fifth mask pattern 162 may be removed to expose the top surface of the fourth mask pattern 160, and the top surface of the fourth mask pattern 160 may be coplanar with that of the sixth mask pattern 164. The sixth mask pattern 164 may have a sidewall adjacent to the first active region 100a of the substrate 100, and the sidewall of the sixth mask pattern 164 may have a fourth angle θ4 relative to the top surface of the substrate 100. The fourth angle θ4 may range from 91° to 100°.

Figure 14A:
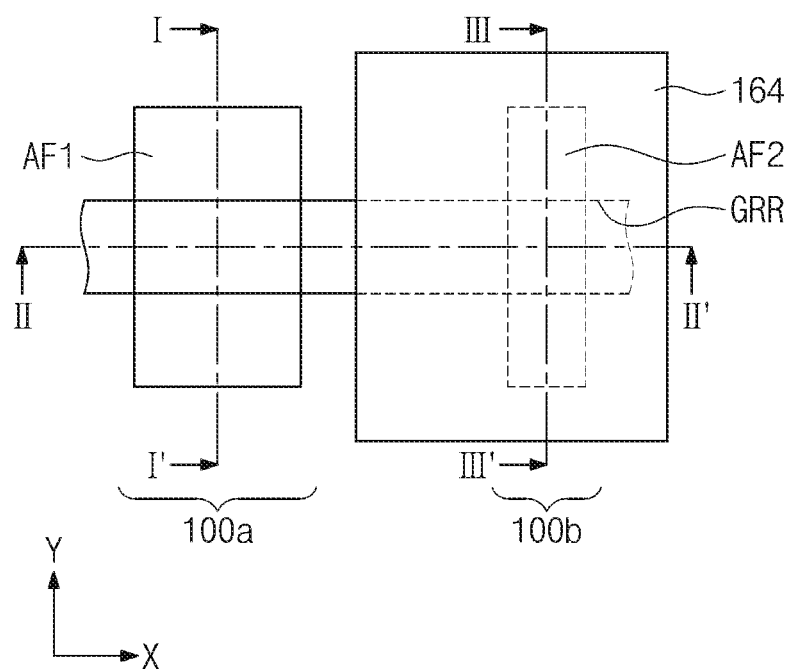
Figure 14B:
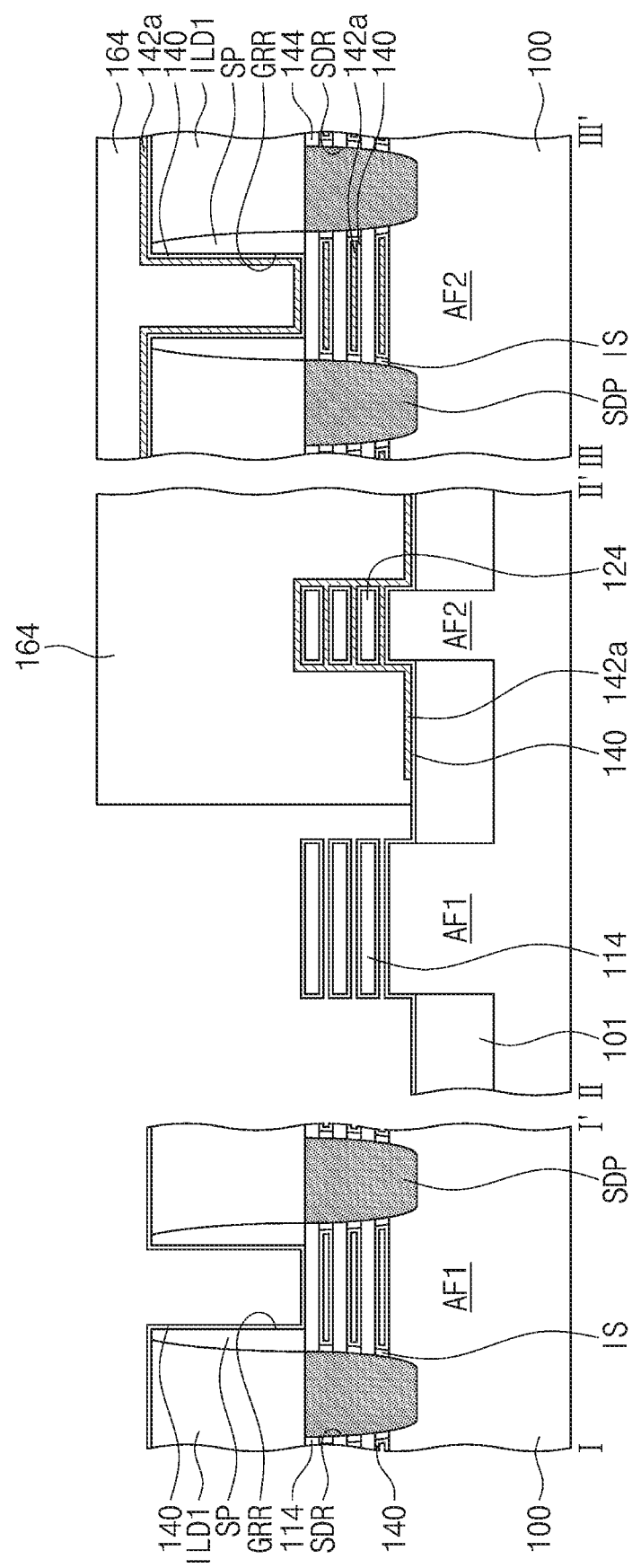

Referring to FIGS. 14A and 14B, the fourth mask pattern 160 may be removed. Accordingly, the gate dielectric layer 140 may be exposed which is formed on the first active region 100a of the substrate 100, and the sidewall of the sixth mask pattern 164 may be exposed which is adjacent to the first active region 100a of the substrate 100. The fourth mask pattern 160 may be selectively removed by an ashing process that uses H2/N2. An etching process may be performed to remove the residual electrode patterns 142b exposed by the sixth mask pattern 164. The removal of the residual electrode patterns 142b may expose the gate dielectric layer 140 that covers or overlaps the top surface and sidewalls of the first active fin AF1 and also covers or overlaps the top and bottom surfaces of the first active patterns 114. The etching process may include one or more of a wet etching process, an ashing process, and a strip process.

Subsequent processes will be omitted because they are the same as those discussed above with reference to FIGS. 9A, 9B, and 10.

According to some embodiments of the present inventive concepts, a second mask pattern used as an etching mask to pattern a first electrode layer may be formed after a first mask pattern is formed on a first region of a substrate from which the first electrode layer will be removed. The first mask pattern may define an area where the second mask pattern is formed. The first mask pattern may be used to allow the second mask pattern to have an optimal interval or spacing from a first active fin formed on the first region of the substrate, and as a result, it may be possible to prevent or reduce damage to a first electrode pattern formed on a second region of the substrate and to prohibit or reduce the likelihood of the first electrode pattern from remaining on the first region of the substrate.

Although the present invention has been described in connection with some example embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the inventive concepts.

What is claimed is:

1. A method of fabricating a semiconductor device, the method comprising:
   forming a plurality of first active patterns on a first active fin of a substrate, wherein the plurality of first active patterns are spaced apart at first distances from each other in a direction perpendicular to the substrate;
   forming a plurality of second active patterns on a second active fin of the substrate, wherein the plurality of second active patterns are spaced apart at second distances from each other in the direction perpendicular to the substrate, wherein the substrate comprises a first region on which the first active fin is formed and a second region on which the second active fin is formed;
   forming a first electrode layer that extends on top surfaces and sidewalls of the first and second active fins and extends on surfaces of the first and second active patterns;
   forming a first mask pattern that extends on the first electrode layer formed on the first region of the substrate;
   forming a second mask pattern that extends on the first electrode layer formed on the second region of the substrate; and using the second mask pattern as an etching mask to etch the first mask pattern and a portion of the first electrode layer that is on the first region of the substrate to form a first electrode pattern on the second region of the substrate by partially etching the first electrode layer formed on the first region of the substrate to form a plurality of residual electrode patterns between the first active patterns and between the first active fin and a lowermost one of the first active patterns.

2. The method of claim 1,
wherein the first mask pattern and the second mask pattern comprise carbon, and
wherein the first mask pattern and the second mask pattern comprise materials having an etch selectivity with respect to each other.

3. The method of claim 1,
wherein the first mask pattern comprises a bottom anti-reflective coating (BARC) layer, and
wherein the second mask pattern comprises a silicon-based spin-on-hardmask (Si-SOH) layer.

4. The method of claim 1, wherein respective widths of the first active fin and the first active patterns are greater than respective widths of the second active fin and the second active patterns.

5. The method of claim 1, wherein forming the first active fin, the first active patterns, the second active fin, and the second active patterns comprises:
forming a plurality of sacrificial layers and a plurality of active layers that are alternately and repeatedly stacked on the substrate;
patterning the sacrificial layers and the active layers to form a plurality of first sacrificial patterns and the first active patterns that are alternately stacked on the first active fin and to form a plurality of second sacrificial patterns and the second active patterns that are alternately stacked on the second active fin; and
selectively removing the first sacrificial patterns and the second sacrificial patterns.

6. The method of claim 1,
wherein a sidewall of the first mask pattern has an angle relative to a top surface of the substrate,
wherein the sidewall of the first mask pattern is adjacent to the second region of the substrate, and
wherein the angle relative to the top surface of the substrate ranges from 80° to 89°.

7. The method of claim 1, wherein forming the first electrode pattern on the second region of the substrate comprises completely removing the first electrode layer formed on the first region.

8. The method of claim 1, further comprising:
removing the second mask pattern to expose the first electrode pattern;
forming a third mask pattern on the first region of the substrate, the third mask pattern exposing the first electrode pattern;
forming a fourth mask pattern on the second region of the substrate, the fourth mask pattern extending on the first electrode pattern; and
using the fourth mask pattern as an etching mask to remove the third mask pattern and the residual electrode patterns.

9. The method of claim 8, wherein the fourth mask pattern is formed to completely extend on the first electrode pattern.

10. The method of claim 1, further comprising:
forming a sacrificial gate pattern on the first active fin, the first active patterns, the second active fin, and the second active patterns;
forming a plurality of spacers on sidewalls of the sacrificial gate pattern; and
removing the sacrificial gate pattern to form a gate recess region,
wherein the first electrode layer is formed to extend on the top surfaces and the sidewalls of the first and second active fins and to extend on the surfaces of the first and second active patterns, the top surfaces and the sidewalls of the first and second active fins and the surfaces of the first and second active patterns being exposed to the gate recess region.

11. The method of claim 1, further comprising:
removing the second mask pattern; and
forming a second electrode layer that extends on the first electrode pattern, the first active fin, and the first active patterns on the first and second regions of the substrate.

12. A method of fabricating a semiconductor device, the method comprising:
forming a plurality of first active patterns on a first active fin of a substrate, wherein the plurality of first active patterns are spaced apart at first distances from each other in a direction perpendicular to the substrate;
forming a plurality of second active patterns on a second active fin of the substrate, wherein the plurality of second active patterns are spaced apart at second distances from each other in the direction perpendicular to the substrate, wherein the substrate comprises a first region on which the first active fin is formed and a second region on which the second active fin is formed;
forming a first electrode layer that extends on top surfaces and sidewalls of the first and second active fins and extends on surfaces of the first and second active patterns;
forming a first mask pattern that extends on the first electrode layer formed on the second region of the substrate; and
using the first mask pattern as an etching mask to etch a portion of the first electrode layer that is on the first region to form a first electrode pattern on the second region of the substrate,
wherein a sidewall of the first mask pattern has an angle relative to a top surface of the substrate,
wherein the sidewall of the first mask pattern is adjacent to the first region of the substrate,
wherein the angle relative to the top surface of the substrate ranges from 91° to 100°, and
wherein forming the first electrode pattern on the second region of the substrate comprises completely removing the first electrode layer formed on the first region.

13. The method of claim 12, wherein forming the first electrode pattern on the second region of the substrate comprises partially etching the first electrode layer that extends on a top surface of an uppermost one of the first active patterns, sidewalls of the first active patterns, and the sidewall of the first active fin to form a plurality of residual electrode patterns between the first active patterns and between the first active fin and a lowermost one of the first active patterns.

14. A method of fabricating a semiconductor device, the method comprising:
forming a plurality of first active patterns on a first active fin on a first active region of a substrate, wherein the plurality of first active patterns are spaced apart at first distances from each other in a direction perpendicular to the substrate;
forming a plurality of second active patterns on a second active fin on a second active region of the substrate, wherein the plurality of second active patterns are spaced apart at second distances from each other in the direction perpendicular to the substrate, wherein the substrate comprises a first region on which the first active fin is formed and a second region on which the second active fin is formed;

forming a device isolation layer in a recess region between the first active fin and the second active fin of the substrate;

forming a first electrode pattern that extends on top surfaces and sidewalls of the first and second active fins and extends on surfaces of the first and second active patterns; and forming a second electrode pattern that extends on the first electrode pattern, the first active fin, and the first active patterns on the first and second regions of the substrate, wherein the second electrode pattern extends on the device isolation layer and has an end adjacent to the first active region of the substrate, wherein a sidewall of the end of the second electrode pattern has an angle relative to a top surface of the substrate, and wherein forming the first active fin, the first active patterns, the second active fin, and the second active patterns comprises:

forming a plurality of sacrificial layers and a plurality of active layers that are alternately and repeatedly stacked on the substrate;

patterning the sacrificial layers and the active layers to form a plurality of first sacrificial patterns and the first active patterns that are alternately stacked on the first active fin and to form a plurality of second sacrificial patterns and the second active patterns that are alternately stacked on the second active fin; and selectively removing the first sacrificial patterns and the second sacrificial patterns.

15. The method of claim 14, wherein the first electrode pattern is between ones of the plurality of first active patterns, and wherein the second electrode pattern is between ones of the plurality of second active patterns.

16. The method of claim 15, wherein a portion of the second electrode pattern on an uppermost one of the second active patterns extends onto sidewalls of the first electrode pattern, and wherein the portion of the second electrode pattern has a U shape.

17. The method of claim 14, wherein a width of the first active fin is greater than a width of the second active fin.

18. The method of claim 14, further comprising:

forming a plurality of source/drain patterns in the substrate on opposite sides of the first electrode pattern; and forming a plurality of contact plugs on the source/drain patterns.

19. The method of claim 14, wherein the angle relative to the top surface of the substrate ranges from 80° to 89°.

* * * * *